US012805337B2

(12) United States Patent
Noori et al.

(10) Patent No.: US 12,805,337 B2
(45) **Date of Patent: *Nov. 17, 2026**

(54) STACKED RF CIRCUIT TOPOLOGY USING TRANSISTOR DIE WITH THROUGH SILICON CARBIDE VIAS ON GATE AND/OR DRAIN

(71) Applicant: MACOM Technology Solutions Holdings, Inc., Lowell, MA (US)

(72) Inventors: Basim Noori, San Jose, CA (US); Marvin Marbell, Morgan Hill, CA (US); Kwangmo Chris Lim, San Jose, CA (US); Qianli Mu, San Jose, CA (US)

(73) Assignee: MACOM TECHNOLOGY SOLUTIONS HOLDINGS, INC., Lowell, MA (US)

(*) Notice: Subject to any disclaimer, the term of this patent is extended or adjusted under 35 U.S.C. 154(b) by 454 days.

This patent is subject to a terminal disclaimer.

(21) Appl. No.: 18/502,334

(22) Filed: Nov. 6, 2023

(65) Prior Publication Data

US 2024/0071962 A1 Feb. 29, 2024

Related U.S. Application Data

(63) Continuation of application No. 17/210,674, filed on Mar. 24, 2021, now Pat. No. 11,881,464.

(Continued)

(51) Int. Cl.
*H10W 44/20* (2026.01)
*H03F 3/193* (2006.01)

(Continued)

(52) U.S. Cl.
CPC ............ *H10W 44/20* (2026.01); *H03F 3/193* (2013.01); *H03F 3/195* (2013.01); *H03F 3/213* (2013.01);

(Continued)

(58) Field of Classification Search
CPC ................. H01L 23/66; H01L 23/5384; H01L 23/5386; H01L 25/0657; H01L 29/1608;

(Continued)

(56) References Cited

U.S. PATENT DOCUMENTS 9,654,004 B1 * 5/2017 Deligianni ............ H02M 3/158
2004/0130021 A1 7/2004 Sridevan (Continued)

FOREIGN PATENT DOCUMENTS

CN 110504922 A 11/2019
EP 3133735 A1 2/2017

(Continued)

OTHER PUBLICATIONS

Examination Report corresponding to Indian Application No. 202247061173 (6 pages) (Feb. 14, 2023).

(Continued)

*Primary Examiner* — Hafizur Rahman
(74) *Attorney, Agent, or Firm* — Myers Bigel, P.A.

(57) ABSTRACT

A radio frequency (RF) power amplifier device package includes a substrate and a first die attached to the substrate at a bottom surface of the first die. The first die includes top gate or drain contacts on a top surface of the first die opposite the bottom surface. At least one of the top gate or drain contacts is electrically connected to a respective bottom gate or drain contact on the bottom surface of the first die by a respective conductive via structure. An integrated interconnect structure, which is on the first die opposite the substrate, includes a first contact pad on the top gate contact or the top drain contact of the first die, and at least one second contact pad connected to a package lead, a contact of a second die, impedance matching circuitry, and/or harmonic termination circuitry.

21 Claims, 12 Drawing Sheets

Related U.S. Application Data

(60) Provisional application No. 63/004,766, filed on Apr. 3, 2020.

(51) Int. Cl.

*H03F 3/195* (2006.01)
*H03F 3/213* (2006.01)
*H10D 62/832* (2025.01)
*H10W 70/60* (2026.01)
*H10W 70/63* (2026.01)
*H10W 70/65* (2026.01)
*H10W 90/00* (2026.01)

(52) U.S. Cl.

CPC ...... *H10D 62/8325* (2025.01); *H10W 70/611* (2026.01); *H10W 70/635* (2026.01); *H10W 70/65* (2026.01); *H10W 90/00* (2026.01); *H10W 44/206* (2026.01); *H10W 44/234* (2026.01)

(58) Field of Classification Search

CPC ..... H01L 2223/6611; H01L 2223/6655; H03F 3/193; H03F 3/195; H03F 3/213; H10W 44/20; H10W 90/00; H10W 70/635; H10W 70/65; H10W 70/611; H10W 44/234; H10W 44/206; H10D 62/8325

USPC ............................................. 330/309; 257/77

See application file for complete search history.

(56) References Cited

U.S. PATENT DOCUMENTS

| | | | | |
|---|---|---|---|---|
| 2015/0243649 | A1* | 8/2015 | Brech | H10D 84/811 257/296 |
| 2016/0285418 | A1 | 9/2016 | Jones et al. | |
| 2016/0285420 | A1* | 9/2016 | Jones | H10W 20/497 |
| 2018/0342467 | A1 | 11/2018 | Lim et al. | |
| 2019/0157152 | A1 | 5/2019 | Sharan et al. | |
| 2020/0058592 | A1 | 2/2020 | Kim et al. | |
| 2020/0105774 | A1 | 4/2020 | Penumatcha et al. | |
| 2020/0235062 | A1* | 7/2020 | Sasaki | H03F 1/523 |
| 2021/0194440 | A1* | 6/2021 | Szymanowski | H03F 3/211 |
| 2021/0194443 | A1* | 6/2021 | Maalouf | H03F 1/565 |
| 2021/0202408 | A1* | 7/2021 | Khalil | H03F 1/565 |

FOREIGN PATENT DOCUMENTS

| | | | |
|---|---|---|---|
| JP | H0548001 | A | 2/1993 |
| JP | 2003017651 | A | 1/2003 |
| JP | 2009164301 | A | 7/2009 |
| JP | 2010165789 | A | 7/2010 |
| JP | 2013197655 | A | 9/2013 |
| JP | 2014146780 | A | 8/2014 |
| JP | 2015195322 | A | 11/2015 |
| JP | 2016528735 | A | 9/2016 |
| JP | 2016207802 | A | 12/2016 |
| JP | 2019096772 | A | 6/2019 |
| KR | 102052294 | B1 | 12/2019 |
| TW | 200303605 | A | 9/2003 |
| TW | 201330189 | A | 7/2013 |
| TW | 201711142 | A | 3/2017 |
| TW | 201834169 | A | 9/2018 |
| WO | 2017187559 | A1 | 11/2017 |

OTHER PUBLICATIONS

Notification of Transmittal of the International Search Report and the Written Opinion of the International Searching Authority, or the Declaration, in corresponding PCT Application No. PCT/US2021/021851 (Jun. 30, 2021).

Chinese Office Action corresponding to Chinese Patent Application No. 202180033178.4 (Foreign Text, 9 Pages, English Translation Thereof, 11 Pages) (mailed Mar. 30, 2026).

* cited by examiner

STACKED RF CIRCUIT TOPOLOGY USING TRANSISTOR DIE WITH THROUGH SILICON CARBIDE VIAS ON GATE AND/OR DRAIN

CLAIM OF PRIORITY

This application is a continuation of U.S. patent application Ser. No. 17/210,674, filed Mar. 24, 2021, which claims priority from U.S. Provisional Application No. 63/004,766, filed Apr. 3, 2020 with the United States Patent and Trademark Office, the disclosures of each of which are incorporated by reference herein.

FIELD

The present disclosure is directed to integrated circuit devices, and more particularly, to structures for integrated circuit device packaging.

BACKGROUND

RF power amplifiers are used in a variety of applications such as base stations for wireless communication systems, etc. The signals amplified by the RF power amplifiers often include signals that have a modulated carrier having frequencies in the megahertz (MHz) to gigahertz (GHz) range. The baseband signal that modulates the carrier is typically at a relatively lower frequency and, depending on the application, can be up to 300 MHz or higher. Many RF power amplifier designs utilize semiconductor switching devices as amplification devices. Examples of these switching devices include power transistor devices, such as MOSFETs (metal-oxide semiconductor field-effect transistors), DMOS (double-diffused metal-oxide semiconductor) transistors, HEMTs (high electron mobility transistors), MESFETs (metal-semiconductor field-effect transistors), LDMOS (laterally-diffused metal-oxide semiconductor) transistors, etc.

RF amplifiers are typically formed as semiconductor integrated circuit chips. Most RF amplifiers are implemented in silicon or using wide bandgap semiconductor materials (i.e., having a band-gap greater than 1.40 eV), such as silicon carbide ("SiC") and Group III nitride materials. As used herein, the term "Group III nitride" refers to those semiconducting compounds formed between nitrogen and the elements in Group III of the periodic table, usually aluminum (Al), gallium (Ga), and/or indium (In). The term also refers to ternary and quaternary compounds, such as AlGaN and AlInGaN. These compounds have empirical formulas in which one mole of nitrogen is combined with a total of one mole of the Group III elements.

Silicon-based RF amplifiers are typically implemented using LDMOS transistors, and can exhibit high levels of linearity with relatively inexpensive fabrication. Group III nitride-based RF amplifiers are typically implemented using HEMTs, primarily in applications requiring high power and/or high frequency operation where LDMOS transistor amplifiers may have inherent performance limitations.

RF transistor amplifiers may include one or more amplification stages, with each stage typically implemented as a transistor amplifier. In order to increase the output power and current handling capabilities, RF transistor amplifiers are typically implemented in a "unit cell" configuration in which a large number of individual "unit cell" transistors are arranged electrically in parallel. An RF transistor amplifier may be implemented as a single integrated circuit chip or "die," or may include a plurality of dies. When multiple RF transistor amplifier die are used, they may be connected in series and/or in parallel.

RF amplifiers often include matching circuits, such as impedance matching circuits, that are designed to improve the impedance match between the active transistor die (e.g., including MOSFETs, HEMTs, LDMOS, etc.) and transmission lines connected thereto for RF signals at the fundamental operating frequency, and harmonic termination circuits that are designed to at least partly terminate harmonic products that may be generated during device operation, such as second and third order harmonic products. The termination of the harmonic products also influences generation of intermodulation distortion products.

The RF amplifier transistor die(s) as well as the impedance matching and harmonic termination circuits may be enclosed in a device package. A die or chip may refer to a small block of semiconducting material or other substrate on which electronic circuit elements are fabricated. Integrated circuit packaging may refer to encapsulating one or more dies in a supporting case or package that protects the dies from physical damage and/or corrosion, and supports the electrical contacts for connection to external circuits. The input and output impedance matching circuits in an integrated circuit device package typically include LC networks that provide at least a portion of an impedance matching circuit that is configured to match the impedance of the active transistor die to a fixed value. Electrical leads may extend from the package to electrically connect the RF amplifier to external circuit elements such as input and output RF transmission lines and bias voltage sources.

Many functional blocks such as impedance matching circuits, harmonic filters, couplers, baluns, and power combiners/dividers can be realized by Integrated Passive Devices (IPDs). IPDs include passive electrical components and are generally fabricated using standard wafer fabrication technologies such as thin film and photolithography processing. IPDs can be designed as flip chip mountable or wire bondable components. The substrates for IPDs usually are thin film substrates like silicon, alumina, or glass, which may allow for ease in manufacturing and packaging with active transistor dies.

Some conventional methods for assembling RF power devices may involve assembling the transistor die and some of the matching network components (e.g., pre-match capacitors, such as MOS capacitors) in a ceramic or overmolded package on a CPC (copper, copper-molybdenum, copper laminate structure) or copper flange. The transistor die, capacitors, and input/output leads may be interconnected with wires, such as gold and/or aluminum wires. Such an assembly process may be slow and sequential (e.g., one package bonded at a time), and assembly costs may be high (e.g., due to cost of gold wires and expensive wire-bond machines).

SUMMARY

According to some embodiments of the present disclosure, a radio frequency (RF) power amplifier device package includes a substrate and a first die attached to the substrate at a bottom surface of the first die. The first die includes a plurality of transistor cells, and top gate or drain contacts on a top surface of the first die opposite the bottom surface. At least one of the top gate or drain contacts is electrically connected to at least one respective bottom gate or drain contact on the bottom surface of the first die by at least one respective conductive via structure. An integrated interconnect structure is provided on the first die opposite the substrate. The integrated interconnect structure includes a first contact pad on the top gate contact or the top drain contact of the first die, and at least one second contact pad connected to a package lead, a contact of a second die, impedance matching circuitry, and/or harmonic termination circuitry.

In some embodiments, the package lead may be a first package lead, and the respective bottom gate or drain contact on the bottom surface of the first die may be electrically connected to a second package lead.

In some embodiments, the integrated interconnect structure may include at least a portion of the impedance matching circuitry for a circuit defined by the transistor cells of the first die.

In some embodiments, conductive routing may be provided on the substrate defining at least a portion of the harmonic termination circuitry for the circuit defined by the transistor cells of the first die. The respective bottom gate or drain contact may be coupled to the second package lead by the conductive routing.

In some embodiments, the top gate contact or the top drain contact having the first contact pad of the integrated interconnect structure thereon may be electrically connected to the respective bottom gate or drain contact by the respective conductive via structure.

In some embodiments, the integrated interconnect structure may be an integrated passive device (IPD) including one or more passive electronic components.

In some embodiments, the first contact pad may be a bond pad, which is electrically connected to the one or more passive electronic components, on a surface of the IPD that is facing the top surface of the first die. The bond pad may be connected to the top gate or drain contact by a conductive bump therebetween.

In some embodiments, the circuit defined by the transistor cells of the first die may be a first stage of a radio frequency (RF) amplifier circuit, and the second die may include transistor cells that define a second stage of the RF amplifier circuit.

In some embodiments, the IPD may include an insulating material between conductive elements thereof to define at least one capacitor integrated therein.

In some embodiments, the second die may include one or more capacitors that define the at least a portion of the impedance matching circuitry.

In some embodiments, the first die may be attached to the substrate at a source contact on the bottom surface thereof adjacent the at least one respective bottom gate or drain contact.

In some embodiments, the at least one respective bottom gate or drain contact may include both a bottom gate contact and a bottom drain contact. The source contact may be between the bottom gate contact and the bottom drain contact on the bottom surface of the first die.

In some embodiments, the first die may include a Group III nitride-based material.

In some embodiments, the first die may include a Group III nitride-based material on silicon carbide (SiC), and the respective conductive via structure may be a through silicon carbide (TSiC) via.

According to some embodiments of the present disclosure, a radio frequency (RF) power amplifier device package includes a substrate and a first die attached to the substrate at a source contact on a bottom surface of the first die. The first die includes a plurality of transistor cells, and top gate and drain contacts at a top surface of the first die opposite the bottom surface. At least one of the top gate or drain contacts is electrically connected to a respective bottom gate or drain contact on the bottom surface by a respective conductive via structure. The top gate contact or the top drain contact is connected to one of impedance matching circuitry or harmonic termination circuitry at the top surface of the first die, and the respective bottom gate or drain contact is connected to another of the impedance matching circuitry or harmonic termination circuitry at the bottom surface of the first die.

In some embodiments, the first die may include a Group III nitride-based material.

In some embodiments, an integrated interconnect structure including at least a portion of the impedance matching circuitry may be provided on the first die opposite the substrate. The top gate contact or the top drain contact is coupled to a second die that is attached to the substrate and/or to a first package lead by the integrated interconnect structure.

In some embodiments, the integrated interconnect structure may be an integrated passive device (IPD) including one or more passive electronic components.

In some embodiments, the integrated interconnect structure may include a first contact pad on a surface thereof that is facing the top surface of the first die, where the first contact pad is on the top gate contact or the top drain contact; and at least one second contact pad on the surface thereof, where the at least one second contact pad is on a contact of the second die and/or is coupled to the one of the package leads by a conductive bump therebetween.

In some embodiments, conductive routing may be provided on the substrate defining at least a portion of the harmonic termination circuitry. The respective bottom gate or drain contact may be coupled to a second package lead by the conductive routing.

In some embodiments, the top gate contact or the top drain contact having the first contact pad of the integrated interconnection structure thereon may be electrically connected to the respective bottom gate or drain contact by the respective conductive via structure.

In some embodiments, the second die may include at least one contact on a surface thereof opposite the substrate, and the at least one second contact pad of the integrated interconnect structure may be on the at least one contact. In some embodiments, the second die may include one or more capacitors. In some embodiments, the second die may include a plurality of transistor cells that define a stage of an RF amplifier circuit.

Other devices, apparatus, and/or methods according to some embodiments will become apparent to one with skill in the art upon review of the following drawings and detailed description. It is intended that all such additional embodiments, in addition to any and all combinations of the above embodiments, be included within this description, be within the scope of the invention, and be protected by the accompanying claims.

DETAILED DESCRIPTION

Figure 1A:
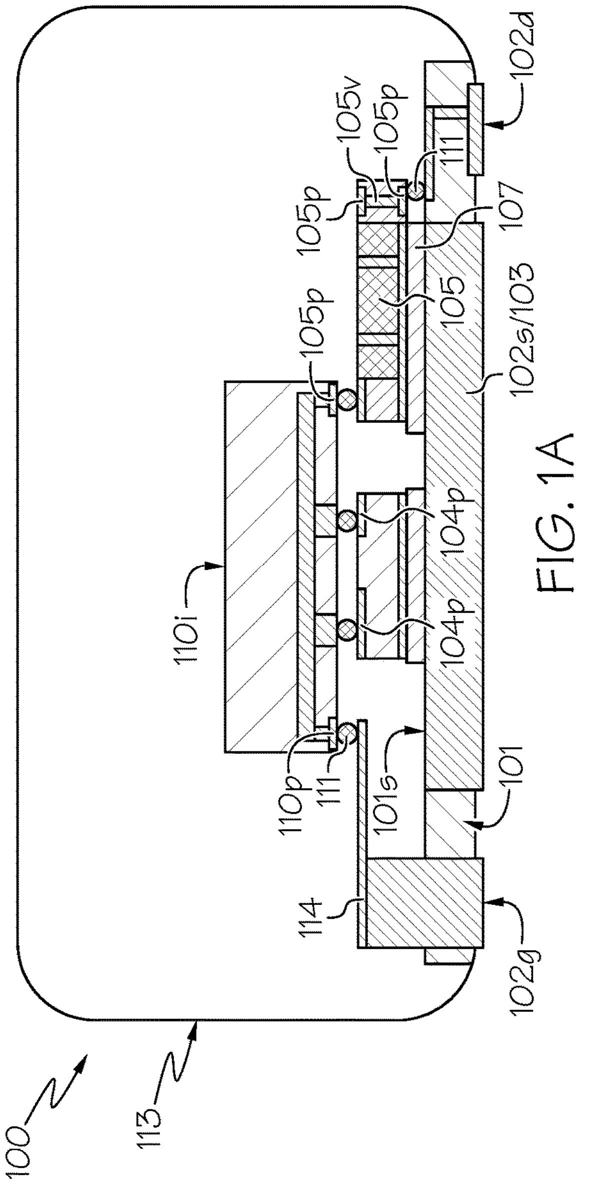
FIG. 1A is a cross-sectional view illustrating an example of an integrated circuit device package including stacked topology and conductive through via connection structures in accordance with some embodiments of the present disclosure.

Some embodiments of the present disclosure may arise from difficulties in assembling and optimizing parameters of the various components included in an integrated circuit device package. For example, some conventional Group III nitride-based RF amplifiers may use bond wires to connect the transistor die to package leads, impedance matching circuits, and/or harmonic termination circuits. These bond wires have inherent inductance that may be used to implement some of the inductors in the impedance matching and/or harmonic termination circuits of the RF amplifiers. The amount of inductance provided may vary with the length and/or the cross-sectional area (e.g., the diameter) of the bond wires. As applications move to higher frequencies, the inductance of the bond wires may exceed a desired amount of inductance for the impedance matching and/or harmonic termination circuits. Bond wires that are very short and/or that have large cross-sectional areas may be used in an effort to decrease the inductance thereof to suitable levels. Very short bond wires, however, may be difficult to solder in place, or may violate design rules for manufacturability which may increase manufacturing costs, and/or may result in higher device failure rates. Bond wires having large cross-sectional areas may require larger gate and/or drain bond pads on the RF amplifier die, which may increase the overall size of the RF amplifier die. Moreover, in some higher frequency applications, even very short bond wires having large cross-sectional areas may have too much inductance such that the matching networks cannot, for example, properly terminate the higher order (e.g., second or third order) harmonics.

Also, performance of some passive RF devices (e.g., IPDs including passive electronic components, such as inductors or capacitors, generally referred to herein as passive devices) may be affected based on proximity to a ground plane. In particular, the quality factor Q of inductor coils may be reduced as a distance is reduced between the windings of the inductor coils and a ground-connected flange (or other grounded structure) of a device package. However, as dies are typically planar structures with conductive contact elements (also referred to herein as contact pads, bond pads, pads, or contacts) on a surface thereof for electrical connections to external dies or devices, increasing the distance between the passive components and the ground plane may increase the length of the bond wires that connect the passive components with one or more active electronic components (e.g., transistors, such as power transistor devices including transistor cells) that are included in an active transistor die (also referred to herein as a transistor die or active die). The increased connection lengths may reduce or negate the effectiveness of the impedance matching networks provided by the passive components, particularly at higher frequencies.

In contrast to some conventional RF power devices that may use wire-bond loops to implement input and output pre-matching, embodiments of the present disclosure provide arrangements of components in packaged RF power products for high power applications (e.g., for 5G or base-station applications), in which connections between components (e.g., between circuit-level components, such as between the bond pads of one or more active transistor dies, and/or between the bond pads of active transistor dies and the gate and/or drain leads of the package) are implemented without the use of wirebonds by one or more structures including conductive components on a layer or substrate, generally referred to herein as integrated interconnect structures.

An integrated interconnect structure or device (or 'integrated interconnect') may generally refer to a structure that includes integrated circuitry such as resistors (including transmission lines), vias, inductors, and/or capacitors on a layer or substrate, for example, a dielectric base structure with integrated traces, vias and/or circuitry that can be used instead of bond wires to reduce and/or avoid related parasitic induction and manufacturing issues. Integrated interconnects may be implemented in some embodiments described herein as passive devices (including IPDs with thin film substrates such as silicon, alumina, or glass) and/or conductive wiring structures (including conductive wires on a redistribution layer (RDL) structure or other substrate). As noted above, IPDs include inductors and/or other passive electrical components, and may be fabricated using standard semiconductor processing techniques such as thin film and/or photolithography processing. IPDs can be flip chip mountable or wire bondable components, and may include thin film substrates such as silicon, alumina, or glass. An RDL structure refers to a substrate or laminate that has conductive layer patterns and/or conductive vias. RDL structures may be fabricated using semiconductor processing techniques by depositing conductive and insulating layers and/or patterns on a base material and by forming vias and copper routing patterns within the structure for transmitting signals through the RDL structure.

Integrated interconnects may be used as described herein to provide connections to inputs, outputs, and/or between stages of transistor dies, as well as to provide circuits that may be useful and/or necessary for operation of the transistor die(s). For example, the integrated interconnects may provide an impedance that is configured to reduce an impedance mismatch between active transistors dies, and/or between an external device connected to the package leads. In particular examples, input and/or output pre-matching network circuits for an active transistor die can be implemented by integrated interconnects, such as IPDs, resulting in minimal or no wire-bonding. In some embodiments, flip-chip IPDs including respective contacts that face the respective contacts of the one or more transistor dies may be used to interconnect multiple transistor dies, for example, in multi-stage amplifier implementations. That is, in some embodiments, the integrated interconnects may provide both an interconnection function and an impedance matching/harmonic termination function, such that the use of wire-bonds in the package can be reduced or eliminated. IPDs as described herein may be free of active components in some embodiments.

In some embodiments, the IPDs that provide the impedance matching networks for the active die (also referred to herein as pre-match IPDs) are placed or stacked directly on top of the gate and/or drain contact pads of the transistor die and/or capacitor chips, thus reducing or minimizing interconnect-related losses with zero or very little wire-bonding. Also, multiple chips can be assembled in a batch process, further reducing assembly time and cost. The elevated height or increased distance (as provided by the stacked arrangement, for example, on top of a 100 μm thick active transistor die) between the passive components and an attachment surface, such as the ground-connected flange of a device package die pad, can reduce capacitive coupling to ground, thus reducing or minimizing negative effects on (and in some cases increasing) the quality factor Q, reducing or minimizing losses of the passive components, and leading to better RF performance.

Additional passive components (e.g., for particular applications) can be included in the passive device and/or on the attachment surface of the package directly beneath the passive device. For example, in some embodiments, capacitors for pre-matching and/or harmonic termination (e.g., MOS capacitors) can be placed between the input pre-match IPD and the attachment surface. Similarly, high density output capacitors can be placed between the output pre-match IPD and the attachment surface for improved video bandwidth (VBW), providing a larger area for use in housing the high-density VBW capacitors. In some embodiments, the passive device may include capacitors integrated therein, such as MIM (metal-insulator-metal) capacitors.

Embodiments of the present disclosure further provide transistor die configurations whereby one or more of the contacts or bond pads of an active transistor die can be simultaneously connected from one side of the die by an integrated interconnect structure or device (e.g., a flip-chip IPD), and from another side of the die using conductive through via connection structures, also referred to herein as conductive vias (e.g., through silicon carbide (TSiC) vias when extending through SiC-based transistor dies). For example, bottom contacts or bond pads on a bottom side of the transistor die (e.g., adjacent the package substrate attachment surface) may be connected to matching elements (e.g., for harmonic termination) in or on the package substrate (e.g., an RDL layer), while top contacts or bond pads on the top side of the transistor die (e.g., opposite the package substrate attachment surface) may be connected to one or more structures including conductive components on a layer or substrate (e.g., integrated interconnect structures), or vice versa, with respective TSiC vias extending between the top and bottom contacts.

Providing the conductive vias connecting the contacts on different surfaces of the transistor die (e.g., extending between respective gate contacts and/or respective drain contacts on the top and bottom surfaces of the transistor die) can eliminate the need for additional IPDs, copper shims, and/or wire-bonding to connect the RF signal to the gate/drain leads of the package. Moreover, the conductive vias provide multiple paths to contact the package gate/drain leads, which allows for at least some impedance matching contributions in/on the substrate (e.g., by conductive routing on the RDL) at the bottom surface of the transistor die, while simultaneously allowing for impedance matching at the top surface of the transistor die (e.g., by stacked IPDs) to further pre-match the fundamental frequency and/or harmonics. The combination of matching contributions at the top and bottom of the transistor die allows for integration of pre-matching circuits into a smaller space, and performance degradation from having to share bond-pad space between multiple functionalities can be reduced or eliminated.

That is, in contrast to some conventional packages where the transistor bond-pad space is shared between drain and tuning wires, or between wires and/or IPDs for pre-matching the fundamental frequency and wires and/or IPDs for harmonic termination, embodiments of the present disclosure can dedicate one entire side of the transistor bond-pad (e.g., the top side) to one function and another entire side (e.g., the bottom side, through the TSiC vias) to the other function. For example, the top bond pads of the active die may be dedicated to impedance matching at the fundamental frequency f0, while the bottom bond pads can provide connections for input/output and harmonic termination, as illustrated in the figures, or vice versa. In particular embodiments, harmonic termination on the input and output can be achieved through the TSiC vias and traces routed onto a bottom side RDL, while the top side is connected with flip-chip IPDs for pre-matching the fundamental frequency. Alternatively, instead of series and shunt wires sharing space on the same bond-pad, shunt tuning wires can be implemented in a flip-chip IPD from the top-side, and the series drain connection from the bottom side directly to the drain lead. More generally, pre-matching, harmonic termination, and/or device inter-connection can be done from either top, bottom or both sides of the transistor bond-pad, by using combinations of conductive through via connections and integrated interconnects as described herein.

Embodiments of the present disclosure can thus use combinations of stacked chip topologies and transistor dies including through via connection structures to greatly reduce problems of coupling between gate and drain bond-wires, which can lead to gain loss and instability. In some embodiments, gate and/or drain bond-wires can be eliminated or reduced, and the thin, low-profile conductive traces in the integrated interconnects (e.g., the pre-match IPDs) may provide little coupling therebetween and/or lower coupling to output wires or traces.

Embodiments of the present disclosure can be used in RF power products for 5G and base-station applications, as well as in radar and/or monolithic microwave integrated circuit ("MMIC") type applications. For example, Group III nitride-based RF amplifiers may be implemented as MMIC devices in which one or more transistor dies are implemented together with their associated impedance matching and harmonic termination circuits in a single, integrated circuit die.

FIG. 1A is a cross-sectional view illustrating an example of an integrated circuit device package including stacked topology and through via connection structures in accordance with some embodiments of the present disclosure. As shown in FIG. 1A, some embodiments of the present disclosure provide an RF power device package 100, which includes an active transistor die 105 including at least one conductive through via structure 105*v* and a capacitor chip or die 104 (e.g., MOS capacitors) assembled on an attachment surface 101*s* of a package substrate 101, with an integrated interconnection device (illustrated as an IPD or other passive device 110*i*) opposite the attachment surface 101*s*.

The active die 105 may include power transistor devices, e.g., defining an RF power amplifier. In some embodiments, the active die 105 may include discrete multi-stage, MMIC, and/or multi-path (e.g., Doherty) transistor devices. The conductive through via structure(s) 105*v* may physically extend through the semiconductor layer structure of the active die 105 to electrically connect contacts 105*p* (such as bond pads) on different sides or surfaces thereof. In some embodiments, the through via structure(s) 105*v* may include conductive gate vias 262, conductive drain vias 264, and/or conductive source vias 266 extending through a Group III nitride-based semiconductor layer structure 230, as described in greater detail below with reference to the active die 705 of FIGS. 7A-7C.

The active transistor dies described herein may be implemented in silicon or using wide bandgap semiconductor materials, such as silicon carbide ("SiC") and Group III nitride materials. In particular embodiments, the active dies may be Group III nitride-based, such as gallium nitride (GaN), and/or silicon carbide (SiC)-based, including unit cell transistors that are connected in parallel in an upper portion of a semiconductor layer structure, and a gate contact and/or a drain contact adjacent a source contact on a lower or bottom surface of the semiconductor layer structure that is adjacent the attachment surface. The term "semiconductor layer structure" may refer to a structure that includes one or more semiconductor layers, such as semiconductor substrates and/or semiconductor epitaxial layers. In FIG. 1A, the active die 105 includes an RF GaN on SiC die, with one contact 105*p* (in this example, the drain contact) including a drain via structure 105*v* (in this example, a through silicon carbide (TSiC) via structure) that provides electrical connection and routing of signals between the top side or top surface of the die 105 to the drain contact 105*p* on the bottom side or bottom surface of the die 105, which is adjacent the attachment surface 101*s*.

In the example of FIG. 1A, the substrate 101 is a redistribution layer (RDL) laminate structure. The RDL 101 may include conductive layers fabricated using semiconductor processing techniques. However, it will be understood that the substrate 101 is not so limited; for example, the substrate 101 may be a printed circuit board (e.g., a multi-layer printed circuit board with metal traces), a ceramic substrate that includes conductive vias and/or conductive pads or any other suitable mounting surface for the active die 105. The bottom side of the RDL 101 includes package leads (in particular, gate 102*g*, drain 102*d*, and source 102*s* leads, collectively package leads 102) that conduct electrical signals between components on the attachment surface 101*s* and an external device (not shown), such as an external circuit board. The attachment surface 101*s* may include one or more conductive die pads 103, which in some embodiments may provide an electrical ground for the components of the package 100. The RDL 101 includes vias and/or multi-layer conductive routing for transmitting signals, to transfer signals from the bottom side drain bond pad 105*p* to the external drain lead 102*d* of the package 100. The signal traces in the RDL 101 may have sufficient spacing (e.g., greater than about 5 μm) away from the source lead 102*s* to avoid shorting of signals to ground and/or introducing harmful parasitic coupling.

As RF amplifiers are often used in high power and/or high frequency applications, high levels of heat may be generated within the transistor die(s) during operation. If the transistor die(s) become too hot, the performance (e.g., output power, efficiency, linearity, gain, etc.) of the RF amplifier may deteriorate and/or the transistor die(s) may be damaged. As such, RF amplifiers are typically mounted in packages that may be optimized or otherwise configured for heat removal. In the example of FIG. 1A, the source lead 102*s* includes or is attached to a conductive heat dissipation structure 103 (illustrated as an embedded conductive slug or via) that provides thermal conductivity (e.g., a heat sink). In particular, a section of the RDL 101 underneath the transistor die 105 may be filled (e.g., greater than about 85% filled, fully filled, or almost fully filled) with a high-density conductive array 103 of copper vias for transmitting heat away from the transistors of the transistor die 105. The conductive structure 103 may also be filled with an embedded copper slug or coin for example, in an embedded packaging process. The transistor die 105 and capacitor chip 104 are attached to the attachment surface 101*s* of the RDL 101 with die-attach materials 107 and techniques, such as eutectic materials, precoat (e.g., AuSn precoat), pre-forms, sintering (e.g., Ag-sintering), etc.

Still referring to FIG. 1A, one or more connections between the active transistor die 105 (in particular, between contacts or bond pads 105*p* on a top side or surface of the transistor die 105) and the package leads 102 are implemented by the integrated interconnect 110*i* (in this example, an IPD 110*i*) and/or the through via structure 105*v*, without wire bonds therebetween. The connections provided by the through via structure 105*v* may further include one or more conductive elements (e.g., conductive traces or vias) in the substrate 101. The connections provided by the passive device 110*i* are opposite to (rather than in) the attachment surface 101*s* or substrate 101, to which the bottom side or surface of the active die 105 is attached. More particularly, the bond pads 105*p* on a top surface of the transistor die 105 are connected to bond pads 110*p* on a facing surface of the IPD 110*i*, and the bond pads 110*p* of the IPD 110*i* are connected to the gate lead 102*g* by conductive wiring structures 114. As noted above, the passive device(s) 110*i* may include passive electronic components such as resistors/transmission lines, inductors, and/or capacitors on a semiconductor or other substrate. The through via structure(s) 105*v* may also provide some series inductance and/or resistance.

In FIG. 1A, the components of the passive device 110*i* are configured to provide an input impedance matching network for a circuit (e.g., an RF amplifier circuit) defined by transistor cells of the active die 105, and is illustrated as an IPD, but passive devices as described herein are not limited thereto. The input impedance matching circuitry may match the impedance of the fundamental component of RF signals input to the RF power device package 100 to the impedance at the input of the active die 105. In the example of FIG. 1A, the IPD 110*i* incorporates an arrangement of inductors and transmission lines for pre-matching the fundamental frequency f0, and also for terminating the harmonics of the fundamental RF signal (e.g., 2f0) that may be present at the input.

In the example of FIG. 1A, the IPD 110*i* for the input pre-matching networks is a flip-chip device including bond pads 110*p* on a surface of the IPD 110*i*. The IPD 110*i* is thus 'flip-chipped' on top of the transistor die 105 and a capacitor chip 104, such that the bond pads 110*p* of the IPD 110*i* are aligned with bond pads 105*p* and 104*p* of the transistor die 105 and the capacitor chip 104, respectively. The IPD 110*i* may include conductive bumps 111 (e.g., conductive epoxy patterns or solder bumps, in some embodiments pre-attached to the IPDs 110) for connecting the bond pads 110*p* to the bond pads 105*p* and 104*p*. A conductive bump 111 may also be pre-placed on the bottom side drain pad 105*p* of the transistor die 105 to connect the drain pad 105*p* to the package drain lead 102*d* through conductive traces and/or vias in the RDL 101.

Figure 1B:
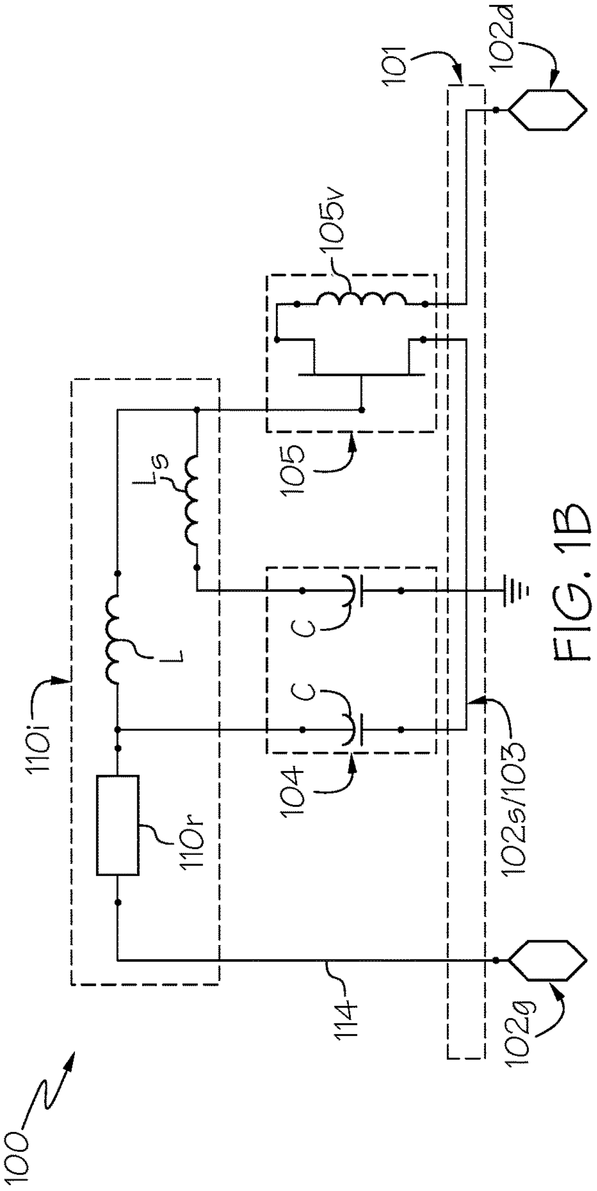
FIG. 1B is an equivalent circuit diagram of the embodiment of FIG. 1A.

The top surfaces of the capacitor chip 104 and transistor die 105 can be aligned to the same height by grinding the wafers (for the die or capacitor chip), and/or or by using pre-forms 107 of different thicknesses to align the heights of the elements 104, and 105 under the IPD 110*i*. As such, the package 100 includes a stacked structure with elements 104 and 105 attached to the attachment surface 101*s* (which may provide electrical connection to ground) between the substrate 101 and the integrated interconnect 110*i*. A combination of the integrated interconnect 110*i* and the at least one through via structure 105*v* provide electrical connections between the elements 104, 105 and the leads 102, without respective bond wires extending between the elements 104 and 105 and the leads 102. A packaging material (illustrated as a plastic over mold (OMP) 113) encapsulates or otherwise provides protection for the dies 105, 110 while providing access to the leads 102 for connection to circuits or devices that are external to the package 100, generally referred to herein as external devices. The over-mold 113 may substantially surround the dies 105, 110, and may be formed of a plastic or a plastic polymer compound, thereby providing protection from the outside environment. Advantages of the over mold type package include reduced overall height or thickness of the package, and design flexibility for the arrangement of and/or spacing between the leads 102. In some embodiments, over mold-type packages as described herein may have a height or OMP thickness of about 400 micrometers (μm) to about 700 μm. In other embodiments, the dies 105, 110 may be included in an open cavity package (e.g., a thermally enhanced package (TEPAC or T3PAC)), including ceramic materials, that defines a cavity surrounding the dies 105, 110 and may have a height or thickness of about 1400 micrometers (μm) to about 1700 μm FIG. 1B is an equivalent circuit diagram of the embodiment of FIG. 1A. The input pre-matching network is implemented by the IPD 110*i* and the input capacitors 104 to provide an L-C matching circuit (e.g., a low-pass L-C) at the fundamental frequency f0, as well as a shunt-L inductance Ls matching circuit (e.g., a high-pass Ls) for optimum termination of the harmonic frequencies (e.g., 2f0). The series transmission line 110*r* in the input IPD 110*i* can be selected to provide appropriate impedance transformation from the transistor die 105 to the gate lead 102*g*. The series transmission lines (e.g., as provided by conductive structures 110*r*) can be treated as an extension of the board transmission line matching network, and electrical widths can be selected or configured to achieve the desired characteristic impedance for the impedance matching. The drain via 105*v* provides a series drain connection from the drain contact 105*p* on the bottom side of the transistor die 105 to the drain lead 102*d*, and itself includes some internal inductance.

The series inductance injected by the gate and/or drain vias 105*v* described herein may be a small fraction of the series inductance injected by comparable gate and drain bond wires (e.g., on the order of 15-20% the inductance injected by conventional gate and drain bond wires), which may ensure that an optimum amount of series inductance for the various matching circuits of the Group III nitride-based RF amplifier may be provided. As such, the gate and/or drain vias 105*v* described herein may contribute to impedance matching and/or harmonic termination circuits at the input and/or output of the transistor die 105. Further contributions may be provided within the package substrate 101, as shown in FIGS. 2A and 2B.

Figure 2A:
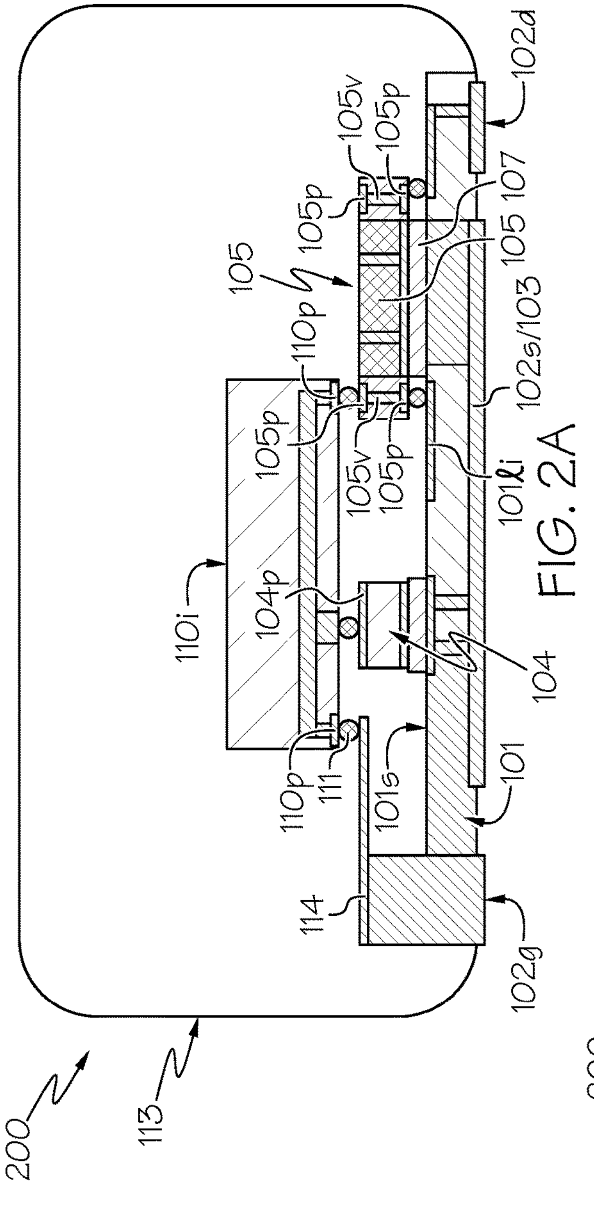
FIG. 2A is a cross-sectional view illustrating an example of an integrated circuit device package including stacked topology and conductive through via connection structures in accordance with some embodiments of the present disclosure.

FIG. 2A is a cross-sectional view illustrating an example of an integrated circuit device package including stacked topology and through via structures in accordance with some embodiments of the present disclosure. As shown in FIG. 2A, an RF power device package 200 includes an active transistor die 105 including multiple through via structures 105*v* and a capacitor chip or die 104 (e.g., MOS capacitors) assembled on an attachment surface 101*s* of a package substrate 101, with an integrated interconnect (illustrated as an IPD or other passive device 110*i*) opposite the attachment surface 101*s*. The package 200 includes components and connections similar to as shown in FIG. 1A, but in the example of FIG. 2A, both the gate and drain contacts 105*p* include respective through via structures 105*v* (in this example, respective TSiC via structures) that provide electrical connections and routing of signals between the top side or surface of the die 105 to gate and drain contacts 105*p*, respectively, on the bottom side or surface of the die 105 adjacent the attachment surface 101*s*.

In FIG. 2A, the gate contact 105*p* on the bottom side of the transistor die 105 is used to implement the harmonic termination on the input side. The bottom gate contact 105*p* contacts conductive trace routing 101*lci* on the RDL 101, which is configured to provide additional inductance and shunt capacitance. As the amount of inductance and/or capacitance that may be needed for the input harmonics may be relatively small, the desired impedance for the input harmonic termination can be achieved with the combination of the inductance provided by the gate-side vias 105*v* and the additional conductive trace routing 101*lci* (e.g., conductive traces and open-shunt stubs) on and/or in the RDL 101. The flip-chip IPD 110*i* and the capacitor die 104 for input pre-matching may thus be more specifically configured to provide impedance matching at the fundamental frequency f0, for example, using a smaller capacitor chip 104 with fewer capacitors (shown as a single capacitor C in FIG. 2B) underneath the flip-chip IPD 110*i*. That is, due to the gate via 105*v*, the top gate contact 105*p* may be dedicated to impedance matching through the IPD 110*i*, while the bottom gate contact 105*p* can provide connections for input harmonic termination 101_lci_ (with the impedance of the gate via 105_v_ defining a portion of the input harmonic termination). Also, in comparison to FIG. 1A, the conductive structure 103 (e.g., a copper slug) is reduced in size and confined beneath the transistor die 105, with separate connections in the RDL 101 between the capacitor die 104 and the source lead 102_s_.

Figure 2B:
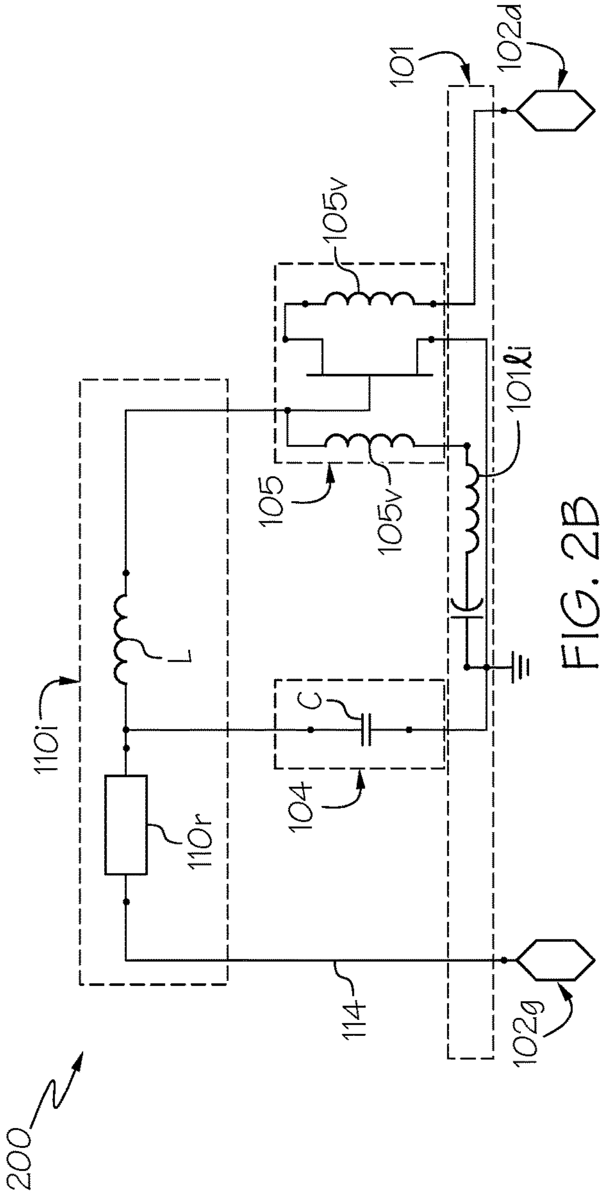
FIG. 2B is an equivalent circuit diagram of the embodiment of FIG. 2A.

FIG. 2B is an equivalent circuit diagram of the embodiment of FIG. 2A. Similar to that shown in FIG. 1B, the input pre-matching network is implemented by the IPD 110_i_ and the input capacitor 104 to provide an L-C matching circuit (e.g., a low-pass L-C) at the fundamental frequency f0. In FIG. 2B, the input harmonic termination is provided by the inductance L and capacitance C of the conductive trace routing 101_lci_ in the package substrate 101. The connections between the gate lead 102_g_ and the drain lead 102_d_ are provided by the series transmission line 110_r_ in the IPD 110_i_ and the series inductance of the drain via 105_v_, respectively.

Figure 3A:
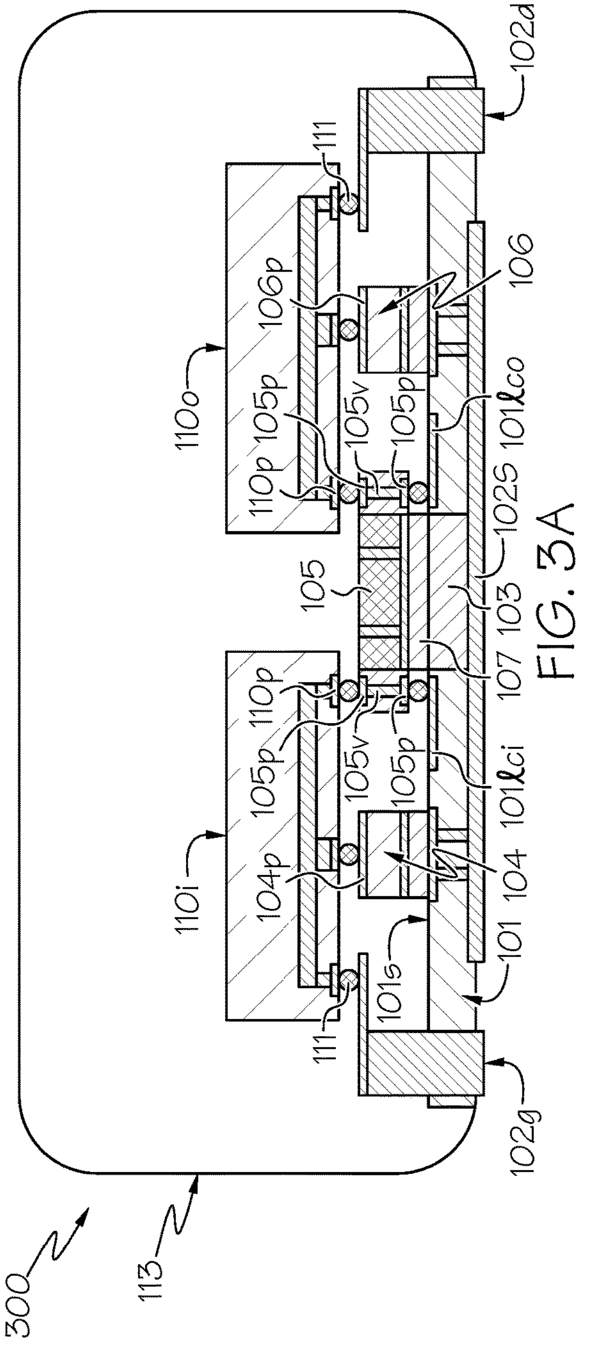
FIG. 3A is a cross-sectional view illustrating an example of an integrated circuit device package including stacked topology and conductive through via connection structures in accordance with some embodiments of the present disclosure.

FIG. 3A is a cross-sectional view illustrating an example of an integrated circuit device package including stacked topology and through via structures in accordance with some embodiments of the present disclosure. As shown in FIG. 3A, some embodiments of the present disclosure provide an RF power device package 300, which includes an active die 105 and capacitor chips or dies 104, 106 assembled on an attachment surface 101_s_ of a package substrate 101. As in FIG. 2A, both the gate and drain contacts 105_p_ of the transistor die 105 include respective conductive through via connection structures 105_v_ (in this example, respective TSiC via structures) that provide electrical connections and routing of signals between the top side of the die 105 to gate and drain contacts 105_p_, respectively, on the bottom side of the die 105 adjacent the attachment surface 101_s_.

The package 300 of FIG. 3A further includes respective integrated interconnects (illustrated as passive devices 110_i_, 110_o_; collectively 110) opposite the attachment surface 101_s_ and connected to the gate and drain contacts or pads 105_p_ at the top side of the transistor die 105. In particular, the components of the passive devices 110 are configured to provide input 110_i_ and output 110_o_ impedance matching networks for a circuit (e.g., an RF amplifier circuit) defined by transistors of the active die 105, and are illustrated as high-Q IPDs, but passive devices as described herein are not limited thereto. The input impedance matching circuits may match the impedance of the fundamental component of RF signals input to the RF power device package 300 to the impedance at the gate pads 105_p_ at the top side of the transistor die 105, and the output impedance matching circuits may match the impedance of the fundamental component of RF signals that are output from the RF power device package 300 to the impedance of the circuitry connected to the drain pads 105_p_ at the top side of the transistor die 105. In the example of FIG. 3A, the IPDs 110 for the input and output pre-matching networks are flip-chip devices including respective bond pads 110_p_ on a surface of the IPDs 110, which are 'flip-chipped' on top of the transistor die 105 and capacitor chips 104, 106, such that the bond pads 110_p_ of the IPDs 110 are aligned with bond pads 105_p_ and 104_p_, 106_p_ of the transistor die 105 and the capacitor chips 104, 106, respectively, and connected thereto by conductive bumps 111. As noted above, the top surfaces of the capacitor chips 104, 106 and transistor die 105 can be aligned to the same height by grinding the wafers (for the die or capacitor chips), and/or or by using pre-forms 107 of different thicknesses to align the heights of the elements 104, 105, and 106.

Still referring to FIG. 3A, the harmonic terminations at both input and output of the transistor die 105 are implemented by the gate and drain vias 105_v_, bottom side contacts or bond pads 105_p_, and trace routing 101_lci_, 101_lco_ on the RDL 101. In particular, the gate via 105_v_ and the gate contact 105_p_ at the bottom side of the transistor die 105 are connected to the conductive trace routing 101_lci_ on the RDL 101, which is configured to provide additional inductance and shunt capacitance to short to ground harmonics (e.g., 2f0) of the fundamental RF signal that may be present at the input of the active die 105. Likewise, the drain via 105_v_ and the drain contact 105_p_ at the bottom side of the transistor die 105 are connected to the conductive trace routing 101_lco_ on the RDL 101, which is configured to provide additional inductance and shunt capacitance to short to ground harmonics of the fundamental RF signal that may be present at the output of the active die 105.

The flip-chip IPDs 110_i_ and 110_o_ on the gate and drain pads 105_p_ at the top side of the transistor die 105 are thus dedicated for pre-matching the fundamental frequency f0 at the input and output of the transistor die 105. As in the example of FIG. 2A, a single capacitor 104 (e.g., a MOS capacitor) may be connected to the input at the top side of the transistor die 105 to provide the impedance matching circuitry, as the input harmonic termination circuitry is implemented by the trace routing 101_lci_ connected to the input at the bottom side of the transistor die 105 by the gate via 105_v_. Similarly, a single capacitor 106 (e.g., a MOS capacitor or high-density capacitor for improved video-bandwidth (VBW)) may be connected to the output at the top side of the transistor die 105 to provide the impedance matching circuitry, as the output harmonic termination circuitry is implemented by the trace routing 101_lco_ connected to the output at the bottom side of the transistor die 105 by the drain via 105_v_. That is, by using the bottom side contacts 105_p_ for harmonic termination, the top side contacts 105_p_ can be used solely for the fundamental frequency pre-match, which can be configured for lower losses and thus provide higher RF performance. As in FIG. 2A, the conductive structure 103 (e.g., a copper slug) is reduced in size and confined beneath the transistor die 105, with separate connections in the RDL 101 between the capacitor dies 104, 106 and the source lead 102_s_.

As such, the package 300 includes a stacked structure with elements 104, 105, and 106 attached to the attachment surface 101_s_ (which may provide electrical connection to ground) between the substrate 101 and the integrated interconnects 110_i_, 110_o_. A combination of the integrated interconnects 110_i_, 110_o_ and the through via structures 105_v_ provide electrical connections between the elements 104, 105, and 106 and the leads 102, without respective bond wires extending between the elements 104, 105, and 106 and the leads 102. In particular, the through via structures 105_v_ provide additional signal routing paths for the gate and/or drain contacts 105_p_, allowing for greater flexibility in incorporating frequency matching topologies at the input and output of the transistor die 105.

Figure 3B:
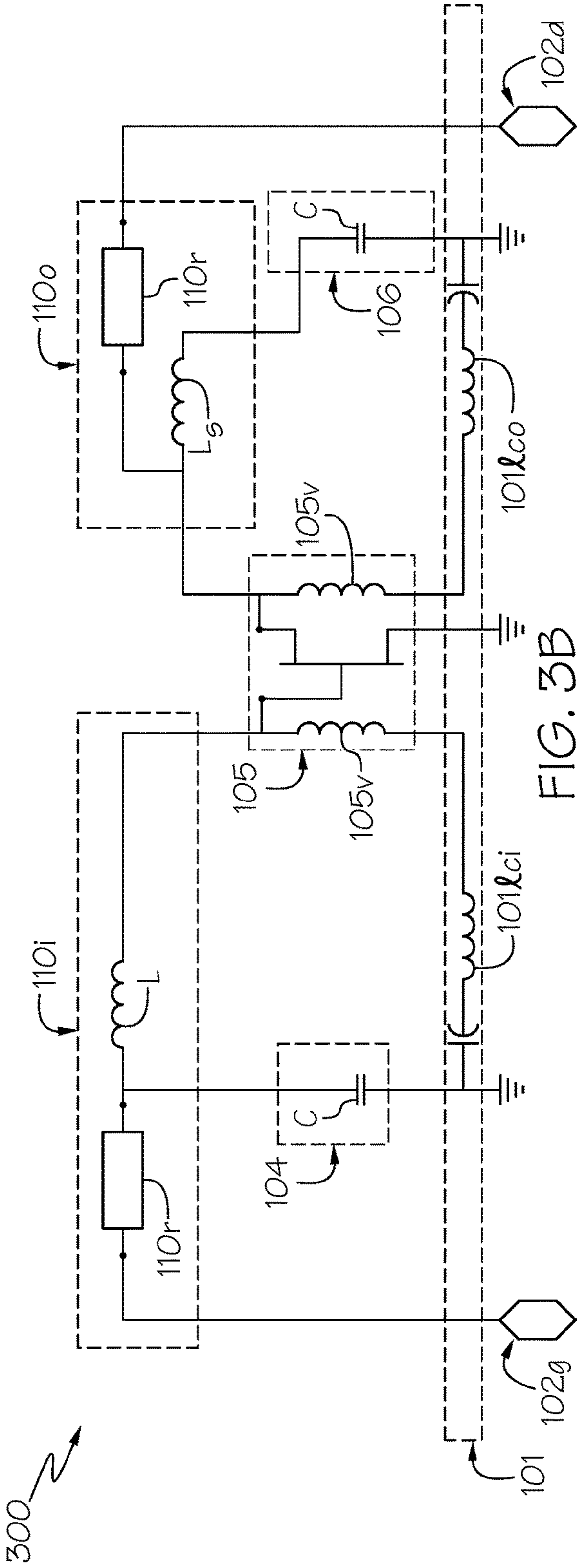
FIG. 3B is an equivalent circuit diagram of the embodiment of FIG. 3A.

FIG. 3B is an equivalent circuit diagram of the embodiment of FIG. 3A. Impedance matching at the fundamental frequency f0 is provided at the top side of the transistor die 105, with the input pre-matching network implemented by the IPD 110_i_ and the input capacitor 104 to provide an L-C matching circuit (e.g., a low-pass L-C), and the output pre-matching network implemented by the output capacitor 106 and the IPD 110_o_ to provide a shunt-L inductance Ls matching circuit (e.g., a high-pass Ls). Termination of the harmonic frequencies (e.g., 2f0) is provided at the bottom side of the transistor die 105, with the input harmonic termination provided by the inductance and capacitance of the conductive trace routing 101*lci* in the package substrate 101 in combination with the gate via 105*v*, and the output harmonic termination provided by the inductance and capacitance of the conductive trace routing 101*lco* in the package substrate 101 in combination with the drain via 105*v*. The series transmission lines 110*r* in each of the input 110*i* and output 110*o* IPDs can be selected to provide appropriate impedance transformation from the gate and drain bond pads 105*p* at the top side of the transistor die 105 to the gate 102*g* or drain 102*d* leads, respectively. The series transmission lines (e.g., as provided by conductive structures 110*r*) can be treated as an extension of the board transmission line matching network, with electrical widths selected or configured to achieve the desired characteristic impedance for the impedance matching.

Figure 4A:
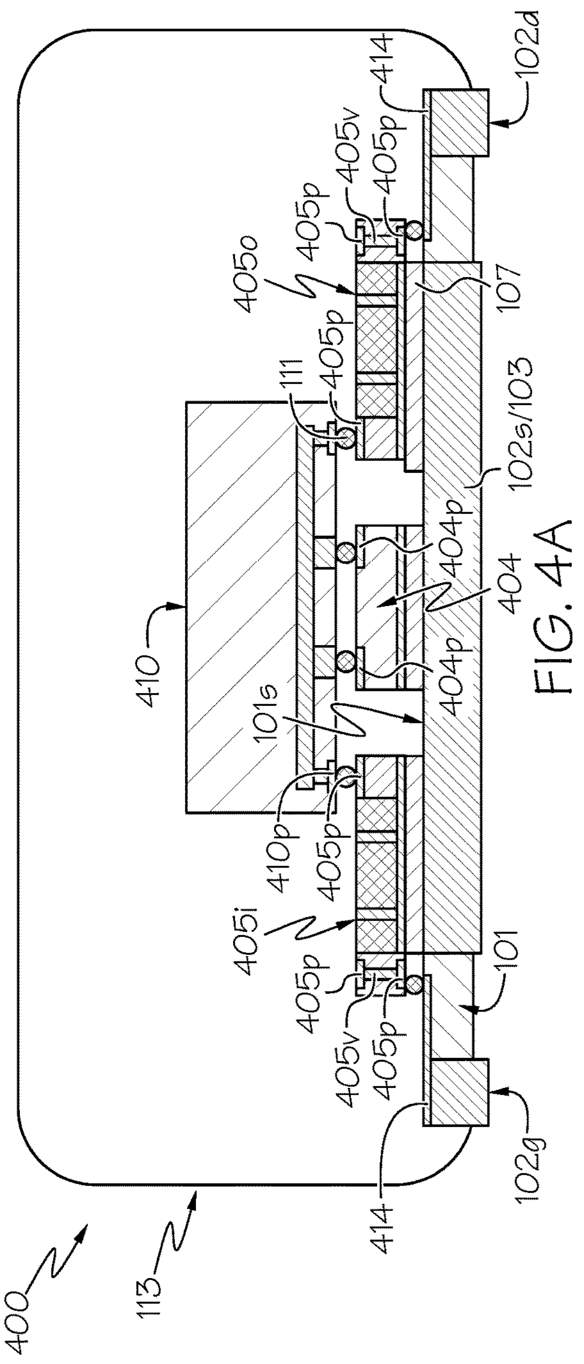
FIG. 4A is a cross-sectional view illustrating an example of an integrated circuit device package including stacked topology and conductive through via connection structures in accordance with some embodiments of the present disclosure.

FIG. 4A is a cross-sectional view illustrating an example of an integrated circuit device package including stacked topology and conductive through via connection structures in accordance with some embodiments of the present disclosure. As shown in FIGS. 4A, RF power device package 400 includes active transistor dies 405*i*, 405*o* and an integrated interconnect (illustrated as an IPD or other passive device 410) assembled on a substrate 101. As in FIG. 1A, the substrate 101 is implemented as a conductive structure 103 (e.g., a copper slug) that provides the attachment surface 101*s*, the source lead 102*s*, and thermal conductivity (e.g., a heat sink) for transmitting heat away from the transistors of the transistor dies 405*i*, 405*o*, and the connections provided by the passive device 410 are opposite to (rather than in) the attachment surface 101*s* or substrate 101.

In the embodiment of FIG. 4A, the active dies 405*i*, 405*o* define a multi-stage packaged RF power amplifier device (shown as two stages by way of example), such as a two-stage GaN-based RFIC product. For example, the active die 405*i* may be a smaller transistor die to implement the driver stage, and the active die 405*o* may be larger transistor die 405*o* (e.g., about 6 to 8 or 7 to 10 times larger in periphery than the driver stage transistor die 405*i*) to implement the output or final stage of the amplifier. The transistor dies 405*i*, 405*o* are attached to the attachment surface 101*s* of the substrate 101/conductive structure 103 that provides the source/thermal lead 102*s*, with an inter-stage capacitor chip or die 404 (e.g., a MOS or MIM capacitor chip with one or two or more separate capacitors integrated in one chip) on the attachment surface 101*s* between the dies 405*i*, 405*o*. An inter-stage passive device (described with reference to IPD 410) is attached to and provides electrical connections between the two transistor dies 405*i*, 405*o*, as well as to the capacitor chip 404.

In particular, in FIG. 4A, the IPD 410 is flip-chip mounted on top of the transistor dies 405*i*, 405*o* and inter-stage matching capacitor chip 404, such that the bond pads 410*p* of the IPD 410 are aligned with bond pads 405*p* and 404*p* of the transistor dies 604*i*, 604*o* and the capacitor chip 404. The bond pads 410*p* of the IPD 410 may contact one or more drain pads 405*p* on the top side of the driver stage transistor die 405*i* that provides a driver drain lead 405*d*, and one or more gate pads 605*p* on the top side of the final stage transistor die 405*o* that provides a final gate lead 405*g*. The IPD 410 may include conductive bumps 111 (e.g., conductive epoxy patterns or solder bumps, in some embodiments pre-attached to the IPD 410) for connecting the bond pads 410*p* to the bond pads 405*p* and 404*p*, without wire bonds therebetween. The top surfaces of the capacitor chip 404 and transistor dies 405*i*, 405*o* can be aligned to the same height by grinding the wafers (for the dies or capacitor chip), and/or or by using pre-forms 107 of different thicknesses to align the heights of the elements 404, 405*i*, 405*o* for connection using the IPD 410.

In the multi-stage amplifier 400, the IPD 410 includes passive components that define inter-stage matching circuitry that is configured to provide impedance matching between the output of the driver stage transistor die 405*i* and the input of the output stage transistor die 405*o*, that is, to match the load of the driver die 405*i* to the input of the final die 405*o*. Although illustrated with reference to two stages 405*i* and 405*o*, it will be understood that multiple input or output transistor dies may be present on the attachment surface 101*s*, with the output of one stage connected to the input of the next stage by respective IPDs 410.

The connections from the package leads 102*g* and 102*d* to the gate and drain bond pads 405*p* at the bottom sides of the dies 405*i* and 405*o* (adjacent the attachment surface 101*s*) are implemented using conductive via structures 405*v* (in this example, TSiC via structures), respectively. In particular, the driver stage transistor die 405*i* includes a gate via 405*v* that extends from the gate pad 405*p* on the top side of the die 405*i* to the gate pad 405*p* on the bottom side of the die 405*i*, providing connection to conductive traces 414 on the RDL 101 and external gate lead 102*g* from the bottom side of the die 405*i*. Similarly, the final stage transistor die 405*o* includes a drain via 405*v* that extends from the drain pad 405*p* on the top side of the die 405*o* to the drain pad 405*p* on the bottom side of the die 405*o*, providing connection to conductive traces 414 on the RDL 101 and external drain lead 102*d* from the bottom side of the die 405*o*.

The conductive through via connections 405*v* provide low inductance and low loss connections to the input and output of the multi-stage packaged RF power amplifier 400. In some embodiments, the connections or bond pads 405*p* at the bottom side of the dies 405*i* and 405*o* can be used for the RF input and RF output leads 102*g* and 102*d*, while the connections or bond pads 405*p* at the top side of the driver die 405*i*, and at the top side of the final die 405*o*, can be connected to a high inductance element (e.g., a DC choke) and used for DC bias feeding of the RF power amplifier device 400.

Figure 4B:
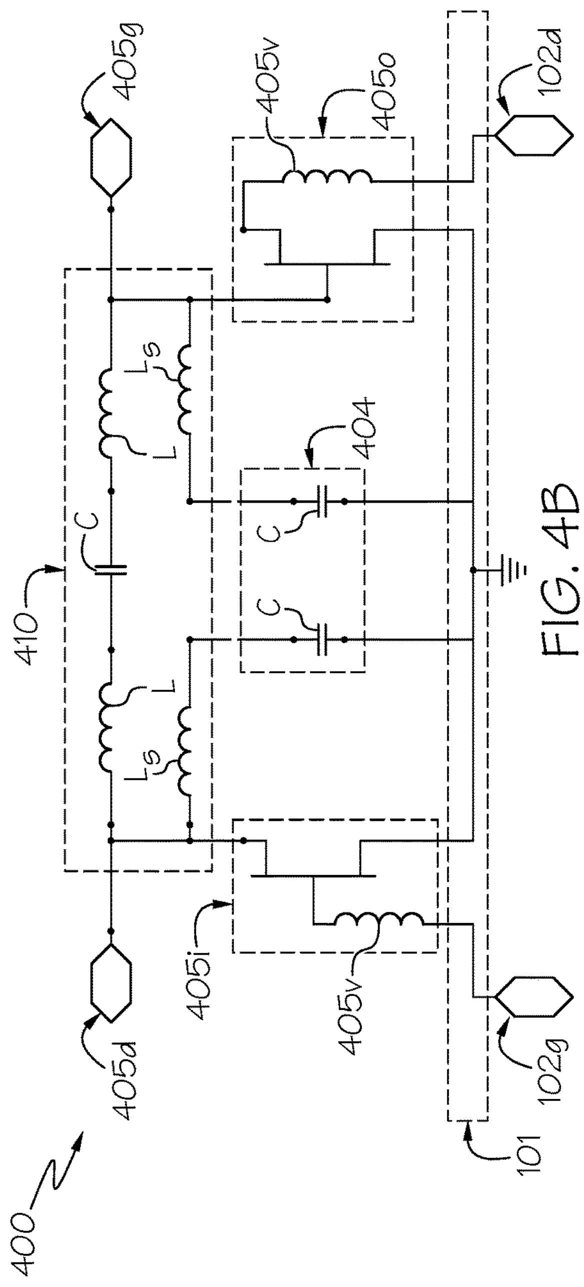
FIG. 4B is an equivalent circuit diagram of the embodiment of FIG. 4A.

FIG. 4B is an equivalent circuit diagram of the embodiment of FIG. 4A. As shown in FIG. 4B, the inter-stage matching network is implemented by capacitors 404 and passive device 410 to provide a shunt-L pre-matching network Ls at the output of the driver stage transistor die 405*i* and at the input of the final stage transistor die 405*o*, as well as a series L-C-L network that connects the driver and final stage transistor dies 405*i* and 405*o*. This topology may provide a broadband response for a multi-stage RF power amplifier product. It will be understood that the inter-stage impedance matching network between the transistor dies 405*i* and 405*o* shown in FIG. 4B is by way of example only, and that inter-stage passive devices 410 that provide electrical connections between two or more active dies according to embodiments of the present disclosure may include or implement other network topologies.

Also, in some embodiments, the capacitors 404 may not be located beneath the output IPD 410, but instead the capacitance can be integrated into the IPD 410, e.g., as MIM capacitors C. The MIM capacitors C may be formed by providing an insulating material between one of the conductive elements of the IPD 410 and one or more of the bond pads 410*p* in some embodiments, as shown in the examples of FIGS. 5A and 5B.

Figure 5A:
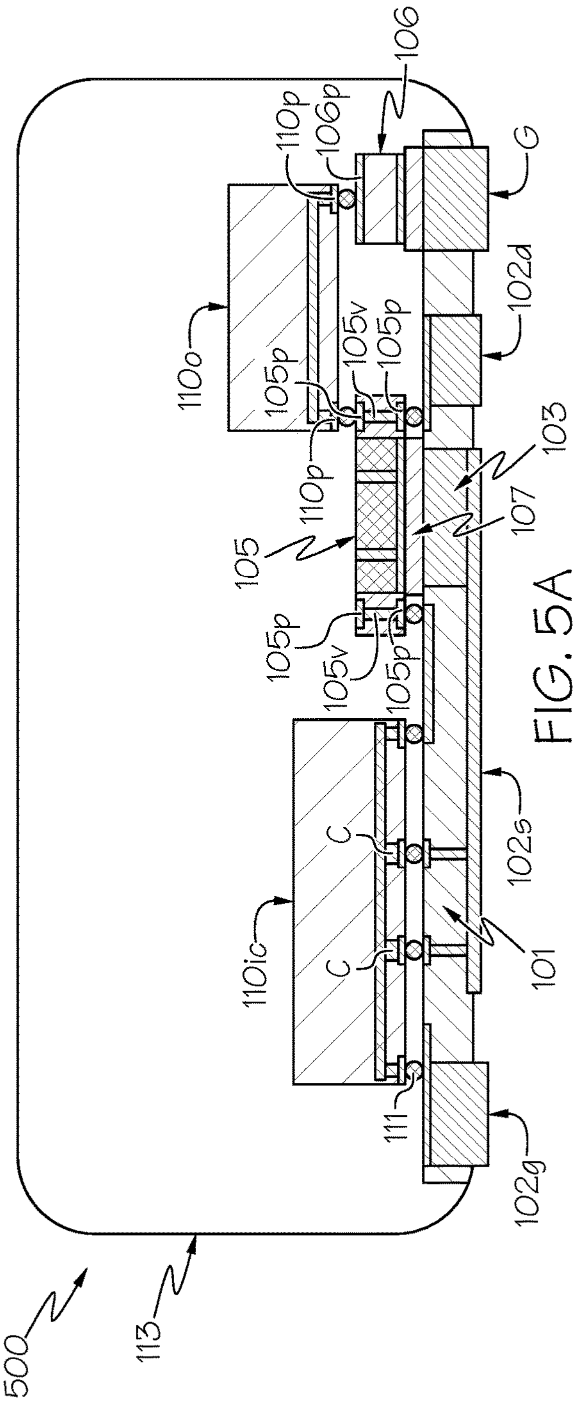
FIG. 5A is a cross-sectional view illustrating an example of an integrated circuit device package including stacked topology and conductive through via connection structures in accordance with some embodiments of the present disclosure.
Figure 5B:
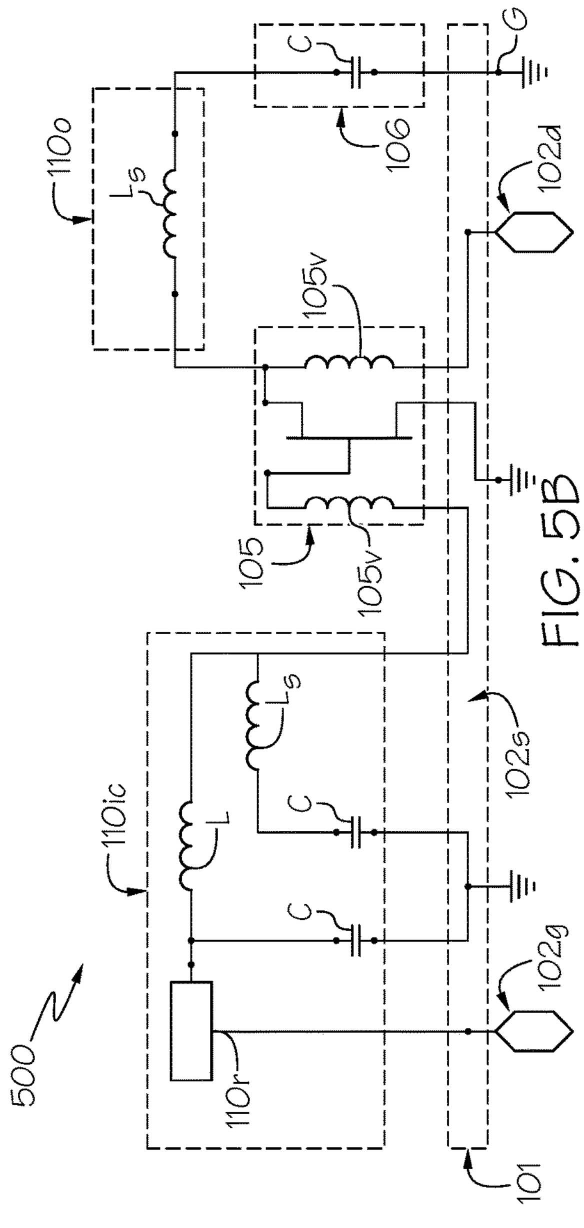
FIG. 5B an equivalent circuit diagram of the embodiment of FIG. 5A.

FIG. 5A is a cross-sectional view illustrating an example of an integrated circuit device package including stacked topology and conductive through via connection structures in accordance with some embodiments of the present disclosure. As shown in FIG. 5A, RF power device package 500 includes include an active die 105 and integrated interconnects (illustrated as IPDs or other passive devices 110*ic*, 1100; collectively 110) assembled on a package substrate 101 to provide electrical connections between the input and output of the transistor die 105 and the package leads 102*g* and 102*d*, respectively. In particular, in FIG. 5A, the IPD 110*o* is flip-chip mounted on top of the transistor die 105 and capacitor chip 106, such that the bond pads 110*p* of the IPD 110*o* are aligned with and contact the drain pad 105*p* and the bond pad 106*p* (on the top sides of the transistor die 105 and the capacitor chip 106) via conductive bumps 111.

The drain pad 105*p* on the top side of the transistor die 105 is dedicated to impedance matching, and is connected to a flip-chip IPD 110*o* that includes passive electronic components that are configured to implement impedance matching circuitry (illustrated as a shunt-L inductance Ls pre-match circuit) at the output of the transistor die 105. A drain via 105*v* (e.g., a TSiC via) connects the drain pads 105*p* on the top and bottom sides of the transistor die 105. The drain pad 105*p* on the bottom side of the transistor die 105 is connected to the RDL 101 and to the external drain lead 102*d*, which exits the package 500 adjacent to the source/thermal lead 102*s*. The other end of the flip-chip IPD 110*o* is connected to (and is supported by) an output capacitor die 106 (e.g., a MOS capacitor or a high-density capacitor for improving video-bandwidth (VBW)). Since the entire drain pad 105*p* on the top side of the transistor die 105 and the flip-chip IPD 110*o* are used to provide the connection to the shunt-L inductance Ls, a lower loss inductance can be realized. The ground end of the output capacitor 106 connects to the output ground lead G.

The transistor die 105 also includes a gate via 105*v* (e.g., a TSiC via) connecting the gate pads 105*p* on the top and bottom sides of the transistor die 105. The gate pad 105*p* on the bottom side of the transistor die 105 is connected to the RDL 101, which includes conductive traces that provide connections to bond pads 110*p* of the flip-chip IPD 110*ic*. The other end of the IPD 110*ic* is connected to the gate lead 102*g*. The IPD 110*ic* includes passive electronic components that are configured to implement an impedance matching circuit at the input of the transistor die 105. In the example of FIG. 5A, capacitors C (e.g., MIM capacitors) are integrated into the IPD 110*ic*, for example, by providing an insulating material between one of the conductive elements of the IPD 110*ic* and one or more of the bond pads 110*p*. Similar to FIG. 2A, the conductive structure 103 (e.g., a copper slug) is reduced in size and confined beneath the transistor die 105, with separate connections in the RDL 101 between the integrated capacitance C in the IPD 110*ic* and the source lead 102*s*.

FIG. 5B an equivalent circuit diagram of the embodiment of FIG. 5A. The input pre-matching network is implemented by the flip-chip IPD 110*ic*, which provides L-C matching circuit (e.g., a low-pass L-C) at the fundamental frequency f0, as well as a shunt-L inductance Ls matching circuit (e.g., a high-pass Ls) for optimum termination of the harmonic frequencies (e.g., 2f0) with the input capacitance C integrated therein. The output pre-matching network is implemented by the flip-chip IPD 110*o*, which provides a shunt-L inductance Ls matching circuit (e.g., a high-pass Ls) with the output capacitance C provided by the capacitor die 106 and connected to the ground lead G. The gate via 105*v* provides additional inductance between the gate pads 105*p* and the IPD 110*ic*, while the drain via 105*v* provides additional inductance between the drain pads 105*p* and the drain lead 102*d*.

Figure 5C:
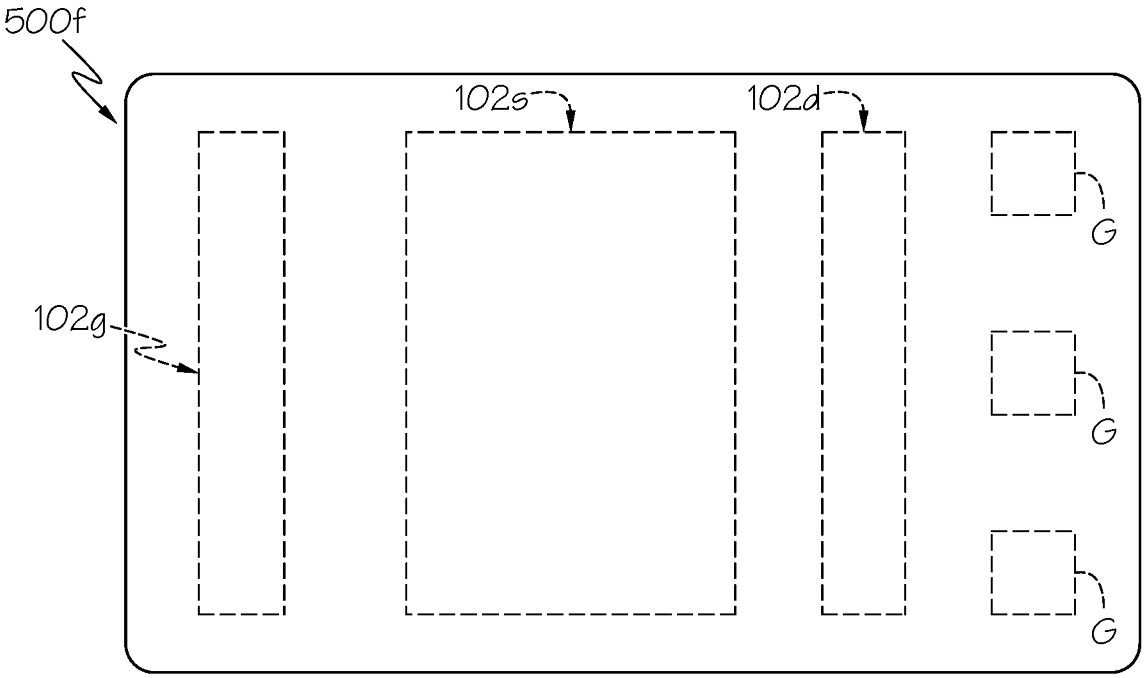
FIG. 5C is a bottom plan view illustrating a package footprint of the embodiment of FIG. 5A in accordance with some embodiments of the present disclosure.

As shown in FIGS. 5A and 5B, since the drain lead 102*d* exits the package 500 between the conductive structure 103 and output ground lead G, embodiments described herein provide a package footprint 500*f* and PCB circuit designs 515*i*, 515*o* to support this topology. FIG. 5C is a plan view illustrating the package footprint 500*f* for the embodiment of FIG. 5A. As shown in FIG. 5C, the ground connection to the output capacitor die 106 is implemented by multiple (shown as three) smaller ground leads G opposite the source/thermal lead 102*s*, with the drain lead 102*d* therebetween. The output ground lead(s) G can be aligned with corresponding grounded vias 515*v* in and to external circuit board 515, such as an RF circuit board as shown in FIG. 5D.

Figure 5D:
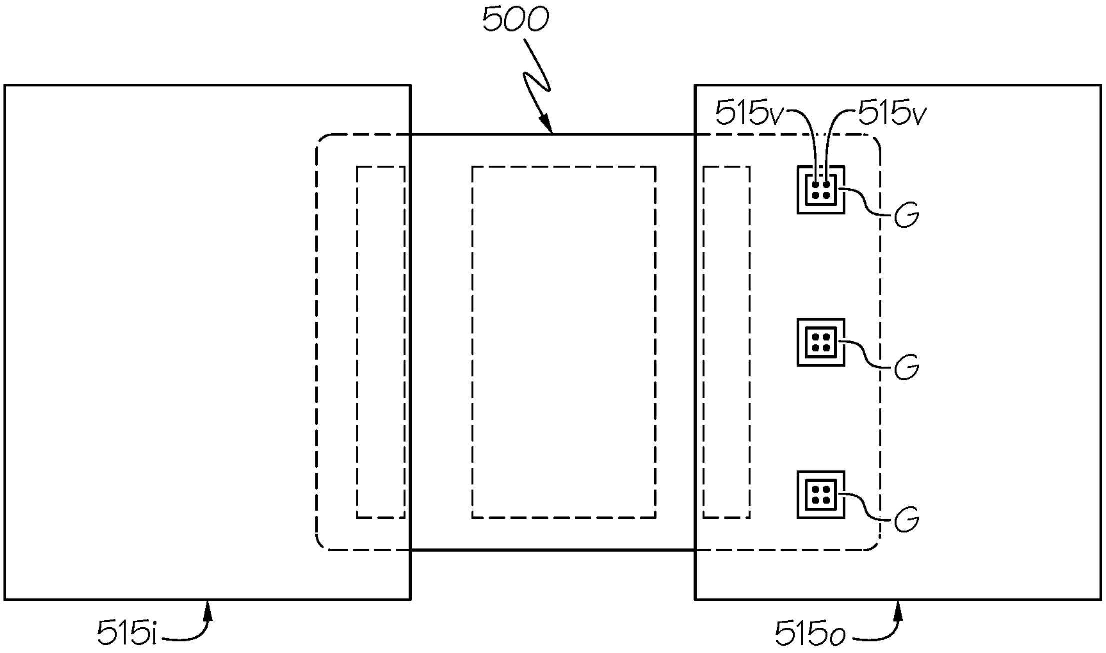
FIG. 5D is a top plan view illustrating the package footprint of the embodiment of FIG. 5C in accordance with some embodiments of the present disclosure.

In particular, FIG. 5D is a top plan view with a transparent package 500 that illustrates the package footprint 500*f* of FIG. 5C, and further illustrates the connections to an input matching circuit board 515*i* and an output matching circuit board 5150 of the external circuit board 515. The input and output matching circuit boards 515*i*, 515*o* may include additional active and/or passive electrical components in some embodiments. The ground leads G may be large enough (e.g., in terms of surface area relative to the footprint 5000 for manufacturing constraints, but small enough to not substantially degrade the performance of the output matching circuit board 515*o*.

Figure 6A:
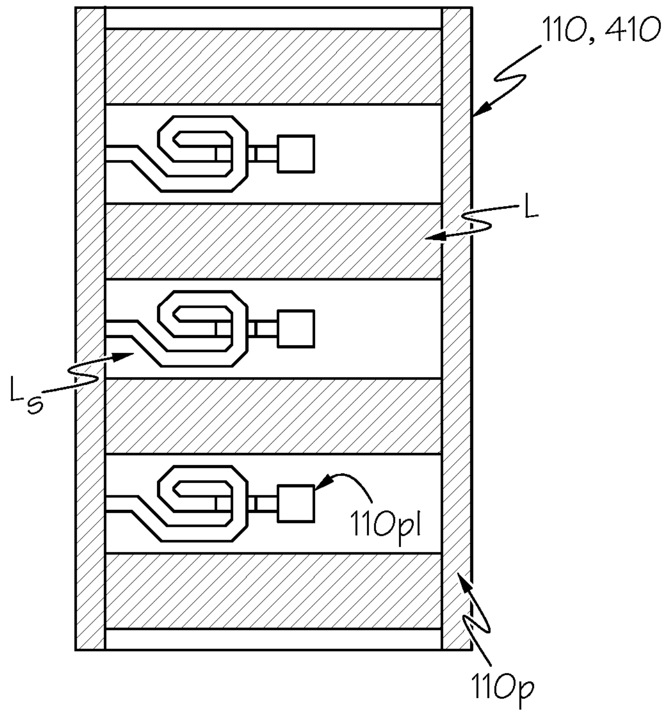
FIGS. 6A and 6B are plan and perspective views, respectively, illustrating examples of IPDs in accordance with some embodiments of the present disclosure.
Figure 6B:
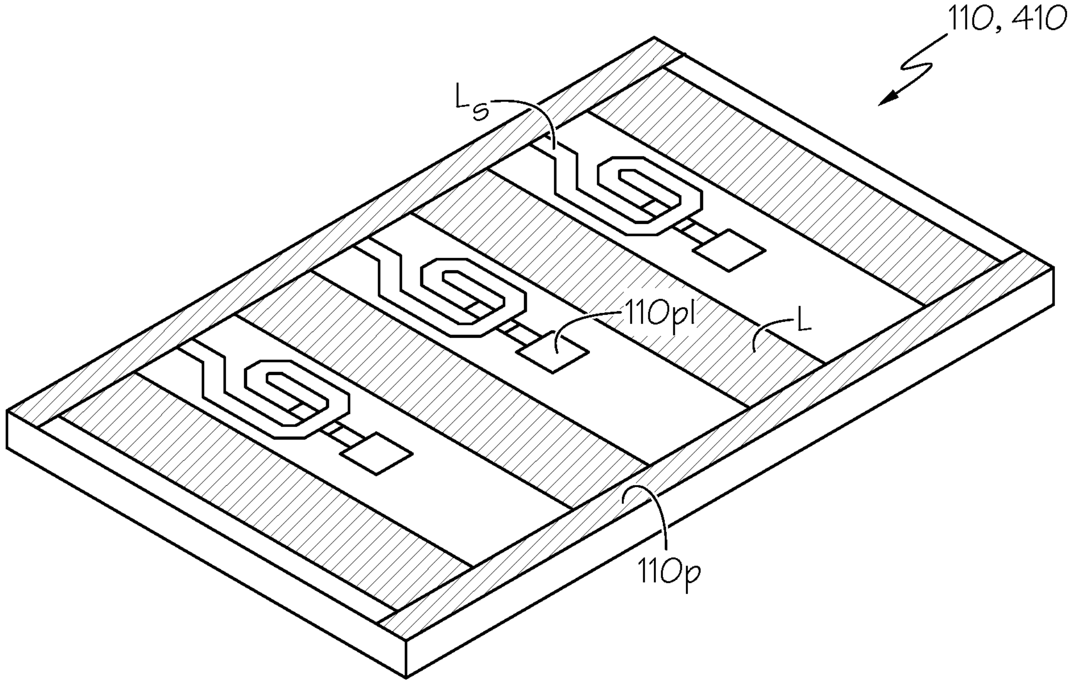

FIGS. 6A and 6B are plan and perspective views, respectively, illustrating examples of IPDs 110, 410 that provide impedance matching and integrated interconnects in accordance with some embodiments of the present disclosure. In the examples of FIGS. 6A and 6B, the precise value of shunt-L inductance needed for appropriate pre-matching of the transistor is implemented using coil inductors Ls. The shape, width and general design of the coil inductors Ls may be optimized to reduce losses. One end of the coil inductors Ls end on a bump or contact pad 110*p*1, which can be pre-attached with conductive bumps (e.g., 111) for attachment to the capacitors (e.g., 104) for pre-matching or high-density capacitors (e.g., 106) for improving video band-width. The width of the series connection strip L used to implement the series inductors can be configured to provide the desired impedance transformation from the transistor die to the drain leads. The series connection strips L may extend between bump or contact pads 110*p*, and can be treated as an extension of the board transmission line matching network, and width of each series connection strip L can be configured to provide the desired characteristic impedance. More generally, any of the passive devices described herein may include or may be implemented using series connection strips L that are coupled between contact pads 110*p* to provide electrical connection between the contact pads 105*p* of one or more active dies 105, and/or between the contact pads 105*p* an active die 105 and a package lead 102, in addition to impedance transformation therebetween. Likewise, any of the passive devices described herein may include or may be implemented using coil inductors Ls configured for connections to capacitors (e.g., capacitors integrated therein or external capacitors by contact pads 110*p*1).

Figure 8:
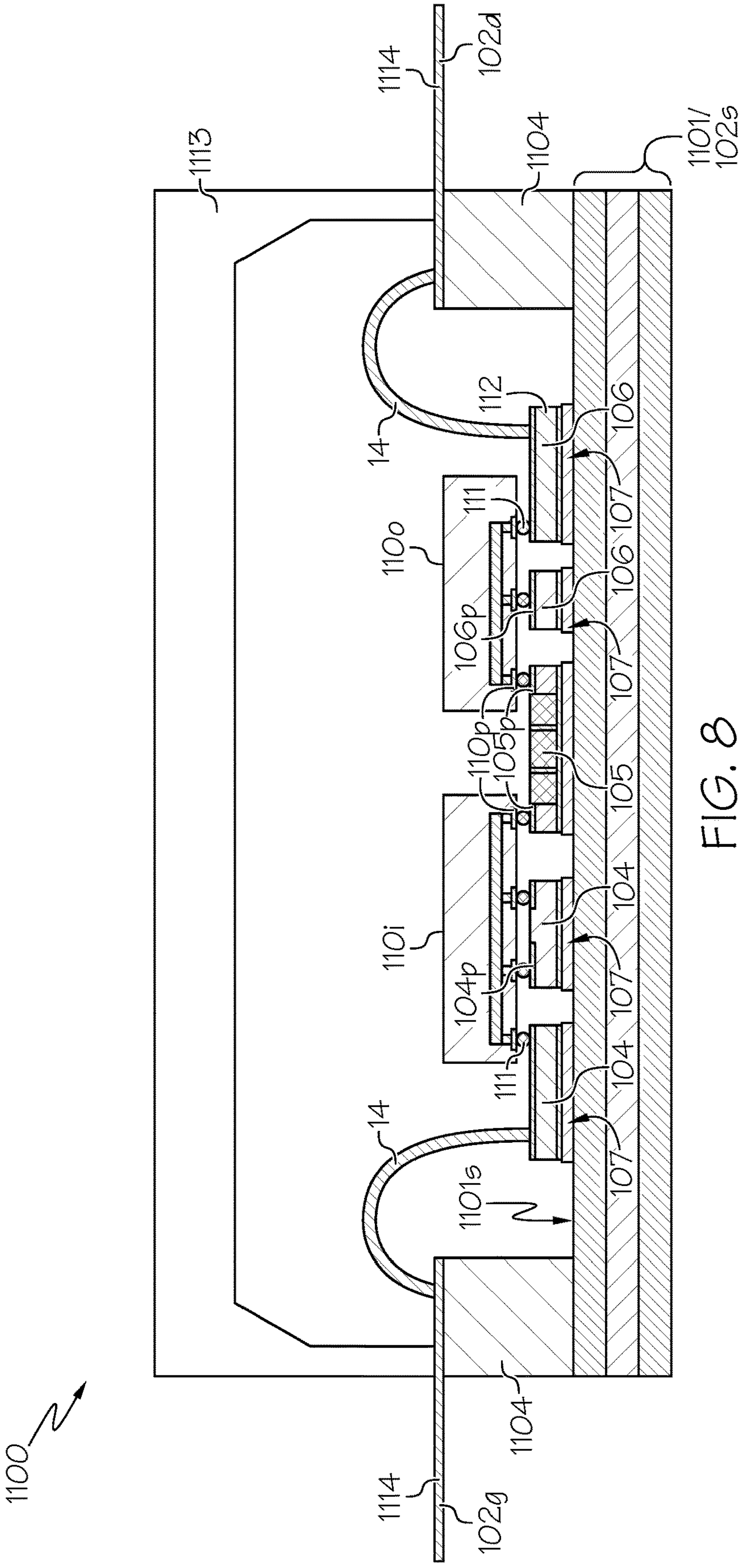
FIGS. 8 and 9 are cross-sectional views illustrating examples of thermally enhanced integrated circuit device packages including stacked topology and conductive through via connection structures in accordance with further embodiments of the present disclosure.
Figure 9:
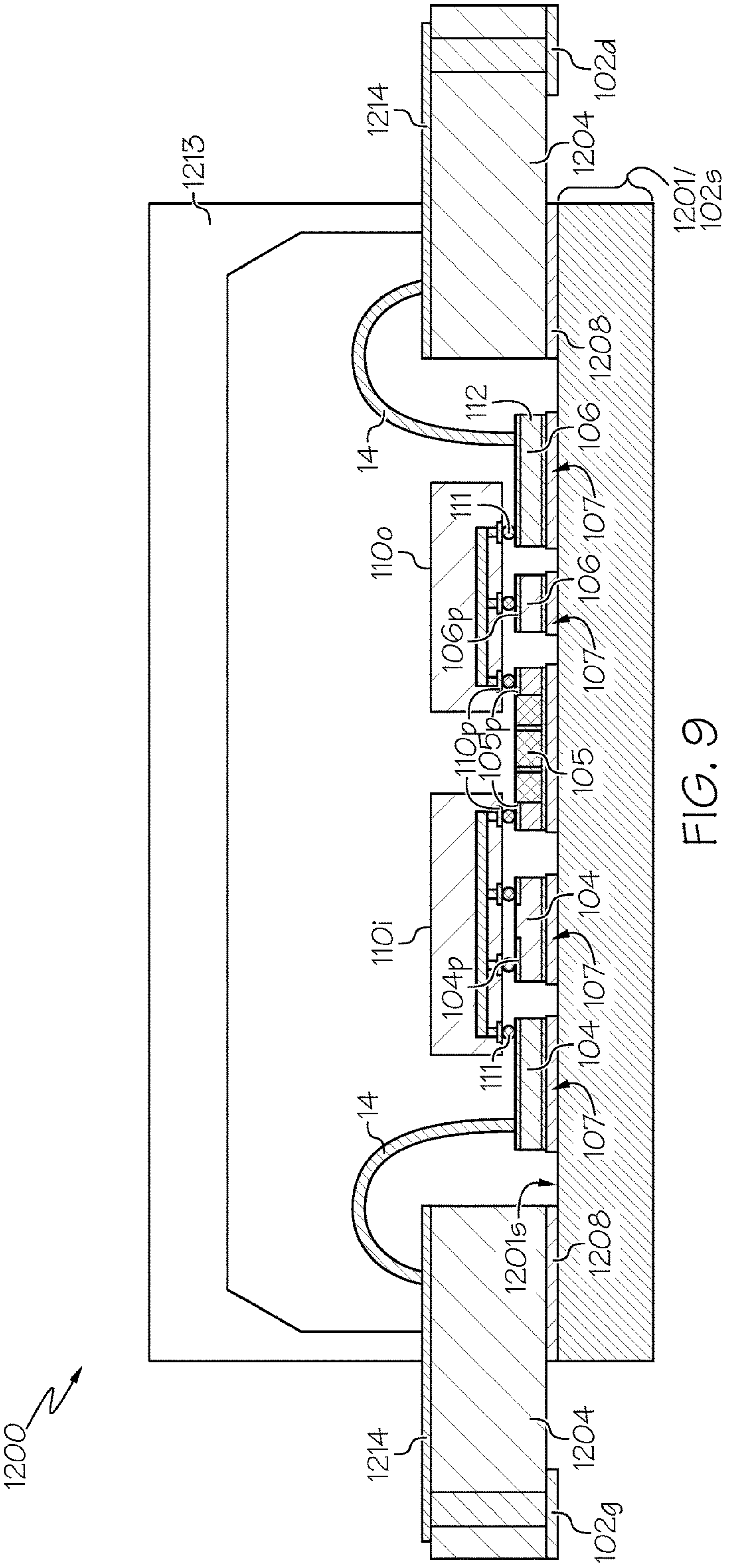

FIGS. 8 and 9 are cross-sectional views illustrating examples of thermally enhanced integrated circuit device packages including stacked topology and conductive through via connection structures in accordance with further embodiments of the present disclosure. The feature sizes in FIGS. 8 and 9 are exaggerated for ease of illustration. As shown in FIGS. 8 and 9, RF power device packages 1100, 1200 include components 104, 105, 106, 110 and connections similar to the packages 100*a*, 100*b*, and 100*c* of FIG. 3A, but are mounted on a conductive base or flange 1101, 1201 and protected by a lid member 1113, 1213 of thermally enhanced packages, rather than a plastic over mold 113. In particular, FIG. 8 illustrates a first implementation (referred to as a TEPAC package 1100) and FIG. 9 illustrates a second implementation (referred to as a T3PAC package 1200) of thermally enhanced packages in accordance with embodiments of the present disclosure.

The TEPAC package 1100 of FIG. 8 may be a ceramic-based package that includes a base 1101 and an upper housing, which may include a lid member 1113 and sidewall members 1104. The lid member 1113 and/or sidewalls 1104 may include ceramic materials (e.g., alumina) and may define an open cavity surrounding the components 104, 105, 106, 110 on the conductive base or flange 1101. The conductive base or flange 1101 provides both an attachment surface 1101*s* for the components 104, 105, 106, 110, as well as thermal conductivity (e.g., a heat sink) for dissipating or otherwise transmitting heat generated by the components outside of the package 1100.

The T3PAC package 1200 of FIG. 9 may also be a ceramic-based package that includes a base 1201 and an upper housing with a lid member 1213 and sidewall members 1204. The lid member 1213 and sidewalls 1204 similarly define an open cavity surrounding the components 104, 105, 106, 110 on the conductive base or flange 1201, which likewise provides both an attachment surface 1201*s* and thermal conductivity (e.g., a heat sink) for dissipating or otherwise transmitting heat outside of the package 1200. In the package 1200, the lid member 1213 may be a ceramic material (e.g., alumina), while the sidewall members 1204 are illustrated as printed circuit board (PCB).

In FIGS. 8 and 9, the flange 1101, 1201 may be an electrically conductive material, for example, a copper layer/laminate or an alloy or metal-matrix composite thereof. In some embodiments, the flange 1101 may include a copper-molybdenum (CuMo) layer, CPC (Cu/MoCu/Cu), or other copper alloys, such copper-tungsten CuW, and/or other laminate/multi-layer structures. In the example of FIG. 8, the flange 1101 is illustrated as a CPC-based structure to which the sidewalls 1104 and/or lid member 1113 are attached. In the example of FIG. 9, the flange 1201 is illustrated as a copper-molybdenum (RCM60)-based structure to which the sidewalls 1204 and/or lid member 1213 are attached, e.g., by a conductive glue 1208. To avoid shorting the bottom gate and drain contact pads 105*p* of the active die 105 to the conductive flange 1101, 1201, a dielectric or other insulating material layer 101 is deposited or otherwise provided on the flange 1101, 1201, and conductive traces 101*lci* and 101*lco* (which are configured to provide additional inductance and/or shunt capacitance for input and output harmonic termination, respectively) are deposited or otherwise provided on the layer 101.

In FIGS. 8 and 9, the active die 105, passive devices (e.g., capacitor chips 104 and 106), and integrated interconnects (collectively 110) are attached to the attachment surface 1101*s*, 1201*s* of the flange 1101, 1201 by respective conductive die attach material layers 107. The flange 1101, 1201 also provides the source lead 102*s* for the package 1100, 1200. The gate lead 102*g* and drain lead 102*d* are provided by respective conductive wiring structures 1114, 1214, which are attached to the flange 1101, 1201 and supported by the respective sidewall members 1104, 1204.

The thicknesses of the sidewall members 1104, 1204, may result in a height differential between the components 104, 105, 106, 110 and the package leads 102*g*, 102*d* relative to the attachment surface 1101*s*, 1201*s*. For example, the combined height of the active die 105 and the integrated interconnects 110*i*, 110*o* thereon may be about 100 μm relative to the attachment surface 1101*s*, while the gate and drain leads 102*g* and 102*d* may be separated from the attachment surface 1101*s* by a distance of about 635 μm. In the examples of FIGS. 8 and 9, respective wire bonds 14 are thus used to connect the package leads 102*g*, 102*d* to contact pads 104*p*, 106*p* of the passive RF components 104, 106 on the attachment surface 1101*s*, 1201*s*. As such, an RF signal input on a the lead 102*g* may be passed through the wire bond 14 to input matching circuits 110*i*, 104 and to a gate terminal 105*p* of the RF transistor amplifier die 105, and the amplified output RF signal may be passed from the drain terminal 105*p* of the RF transistor amplifier die 105 to the output matching circuits 110*o*, 106 and from there to the bond wire 14 for output through lead 102*d*. It will be appreciated, however, that the wire bonds 14 may be omitted in other embodiments and different electrical connections may be used.

Integrated circuit device packages including stacked topology structures in accordance with embodiments of the present disclosure may provide further advantages in that the stacked interconnection structures may allow for thinner or reduced-height packages in comparison to some conventional designs. In over mold package embodiments (e.g., as shown in FIGS. 1-5), the routing of the package leads at the bottom of the package may also allow for packaging flexibility. For example, changes in height and/or spacing of the package leads can be accommodated by modifying the layout of the traces on the circuit board/PCB based on the modified package footprint. Thermally-enhanced package embodiments (e.g., as shown in FIGS. 8-9) may offer similar advantages, but may require changes to the package dimensions (e.g., flange height and/or package lead spacing) relative to standardized dimensions.

Accordingly, in embodiments of the present disclosure, electrical connections between components (e.g., between circuit-level components, such as between the contact pads of one or more active transistor dies, and/or between the contact pads of active transistor dies and the gate and/or drain leads of the package) are implemented by one or more integrated interconnect structures (e.g., conductive wiring structures and/or passive devices, such as IPDs) physically extending between the components, rather than by wirebonds. That is, the integrated interconnects may provide both an interconnection and an impedance matching/harmonic termination function, such that the use of wirebonds in the package can be reduced or eliminated.

As described herein, some embodiments of the present disclosure use IPDs 'flipped over' on top of the transistor and capacitors. The extra elevation of the IPD above the ground plane (e.g., as provided by conductive structures that may also define the attachment surface for the active dies) of the package provides higher Q, and lower loss pre-match. The majority of the space beneath the flipped IPD can be used for capacitors, such as the high-density capacitors typically used on the output. Larger value capacitance can be used in the available space, thus improving the video-bandwidth of the device. To connect the RF signal from the IPD back to the RDL and gate/drain leads, a copper shim or IPD with TSVs can be used. The IPDs can be configured for both pre-matching of the fundamental frequency as well as optimum termination of the harmonic frequencies.

In addition, transistor dies as described herein may include conductive through via structures that provide additional signal routing paths at multiple sides or surfaces of the active transistor die. Pursuant to particular embodiments of the present invention, Group III nitride-based RF amplifiers are provided that include transistor dies that have gate contacts, drain contacts, and/or source contacts located on the same side of the transistor die, e.g., the bottom surface of the die adjacent the attachment surface of the package substrate. The transistor die may include one or more gate vias and one or more drain vias that are used to connect a gate bus and/or a drain bus that are on the top side of the transistor die to the respective gate and drain contacts that are on the back side of the transistor die. The length of the conductive vias may be a small fraction (e.g., 10-30%) of the length of conventional bond wires, and hence the inductance of the connections between the gate and drain buses and the carrier substrate may be reduced significantly.

Figure 7A:
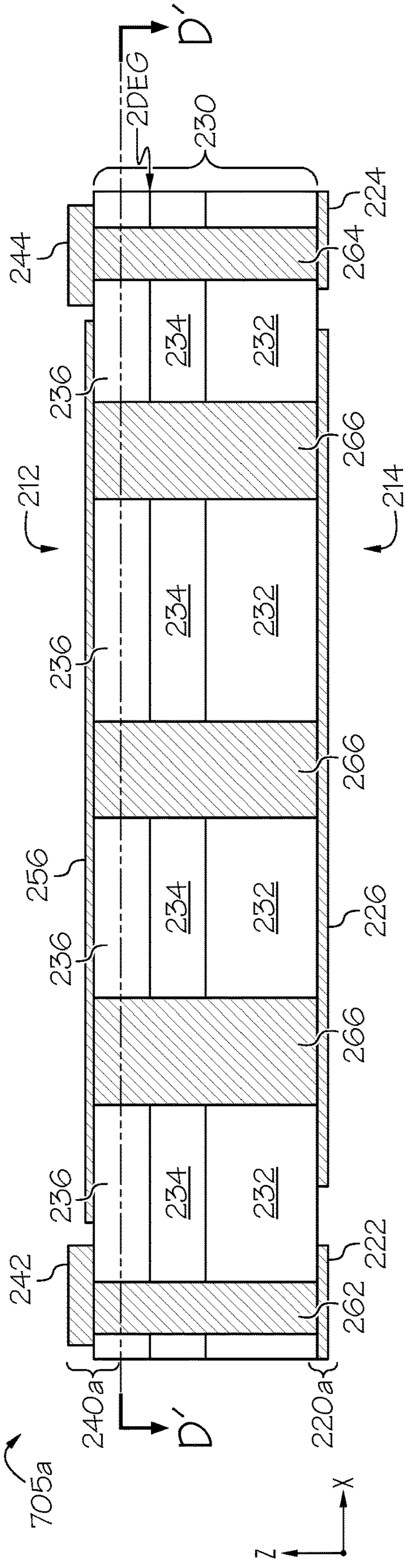
FIG. 7A-7C are cross-sectional views illustrating examples of active transistor dies including conductive through via connections between bond pads on opposing surfaces in accordance with some embodiments of the present disclosure.
Figure 7B:
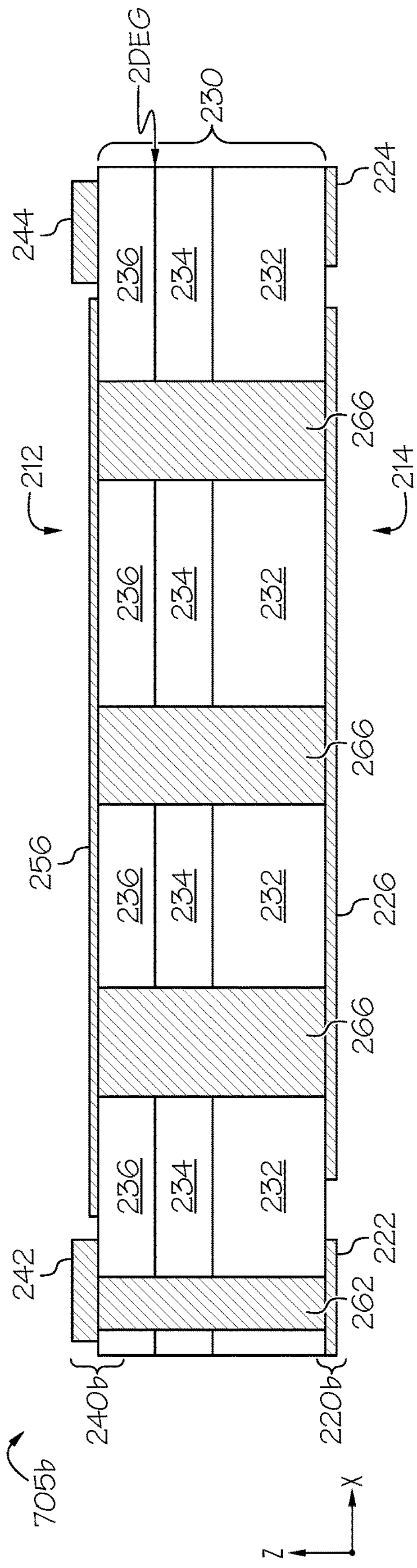
Figure 7C:
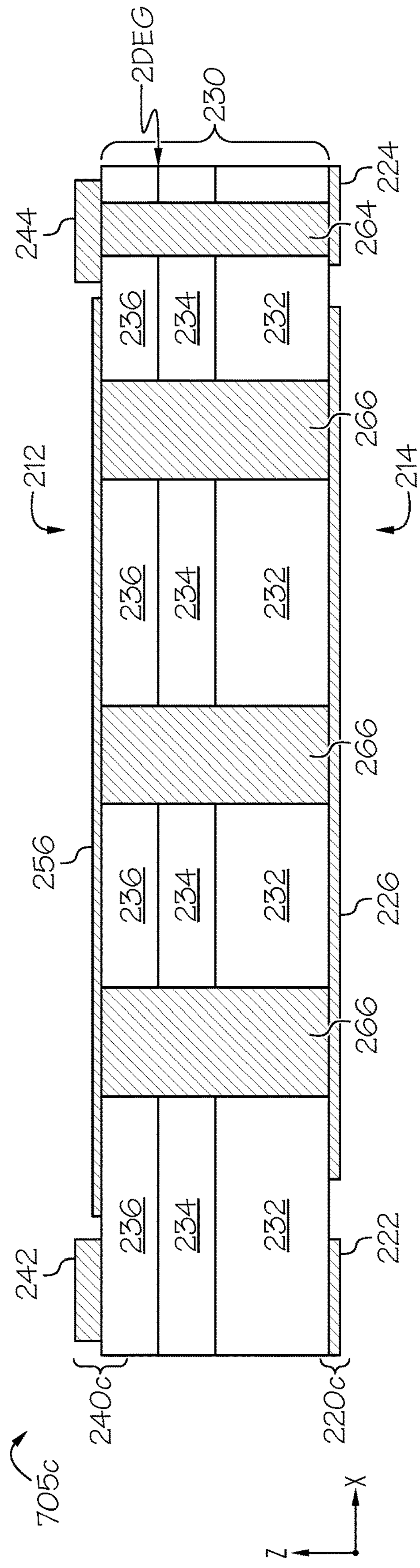

FIGS. 7A, 7B, and 7C are cross-sectional views illustrating examples of Group III nitride-based transistor dies 705*a*, 705*b*, and 705*c* (collectively 705) including conductive through via connections between bond pads on opposing surfaces in accordance with some embodiments of the present disclosure. The transistor dies 705 may represent the transistor dies 105 and/or 405 described herein.

Referring now to FIGS. 7A-7C, the Group III nitride-based transistor die 705 includes a semiconductor layer structure 230. A plurality of unit cell transistors are provided in an upper portion of the semiconductor layer structure 230, and a source contact 226 is provided on a lower or bottom surface 214 that is configured to be attached to a carrier substrate, e.g., an attachment surface 101*s* of a package substrate 101.

In the examples of FIGS. 7A-7C, the transistor die 705 is a Group III nitride-based HEMT RF transistor amplifier die that has an upper side or top surface 212 and a lower side or bottom surface 214. The RF amplifier die 705 includes a bottom side metallization structure 220*a*, 220*b*, 220*c* (collectively 220), a semiconductor layer structure 230, and a top side metallization structure 240*a*, 240*b*, 240*c* (collectively 240) that are sequentially stacked. The semiconductor layer structure 230 may include at least a channel layer 234 and a barrier layer 236 formed on a semiconductor or insulating substrate 232 (such as a SiC or sapphire substrate). The substrate 232 may be a growth substrate, and, even if formed of a non-semiconductor material, may be considered to be part of the semiconductor layer structure 230. Due to the difference in bandgap between the barrier layer 236 and the channel layer 234 and piezoelectric effects at the interface therebetween, a two dimensional electron gas (2DEG) is induced in the channel layer 234 at a junction between the channel layer 234 and the barrier layer 236.

As shown in FIGS. 7A-7C, the top side metallization structure 240 includes a top gate contact or bond pad 242, and a top drain contact or bond pad 244 on the top surface 212 of the die 705. The bottom side metallization structure 220 may include a source contact 226, and one or more additional contacts 222 and/or 224. Each of these contacts 242, 244, 222, 224, 226 may comprise, for example, an exposed copper pad. In particular, in FIG. 7A, the bottom side metallization structure 220*a* includes a bottom gate contact 222, a bottom drain contact 224, and a bottom source contact 226 therebetween on the bottom surface 214. In FIG. 7B, the bottom side metallization structure 220*b* includes a bottom gate contact 222 and a bottom source contact 226 on the bottom surface 214. In FIG. 7C the bottom side metallization structure 220*c* includes a bottom drain contact 224 and a bottom source contact 226 on the bottom surface 214. That is, in some embodiments (as shown in FIG. 7A), both gate and drain contacts 222 and 224 may be provided on the bottom surface 214 of the die with the source contact 226 therebetween, while in other embodiments (as shown in FIGS. 7B and 7C), only one of the gate or drain contacts 222 or 224 is provided on the bottom surface of the die 705 adjacent the source contact 226.

A plurality of conductive vias 262, 264, 266 (e.g., metal-plated or metal-filled vias) extend from the top metallization structure 240 through portions of the semiconductor layer structure 230 to provide electrical connections to the bottom metallization 220. For example, the source contact 226 on the bottom surface 214 of the die 705 may be electrically connected to a source contact 256 by one or more source vias 266. The die 705 may further include conductive vias 262 and 264 extending between one or more of the top gate and drain contacts 242 and 244 to respective bottom gate and drain contacts 222 and 224. In particular, in FIGS. 7A and 7B, the top gate contact 242 may be physically and electrically connected to the bottom gate contact 222 by one or more conductive gate vias 262. In FIGS. 7A and 7C, the top drain contact 244 may be physically and electrically connected to bottom drain contact 224 by one or more conductive drain vias 264.

Although the conductive vias 262, 264, 266 are illustrated as visible in the same cross-sectional view in FIGS. 7A-7C, in some embodiments one or more of the vias 262, 264, 266 may be offset from one another. For example, the three illustrated source vias 266 may be aligned along a same axis, while the gate vias 262 and/or the drain vias 264 may be offset relative to the axis along which the three source vias 266 are aligned, as more easily seen along line A-A' in the view of FIG. 7D. Offsetting the conductive gate vias 262 and the conductive drain vias 264 from the conductive source vias 266 may increase the distance between conductive vias, 262, 264, 266, which can reduce the possibility of cracks in the die 705 due to mechanical weaknesses. This arrangement also reduces parasitic gate-to-source and/or parasitic source-to-drain coupling that may occur between the various vias 262, 264, 266, which may otherwise result in gain loss and/or instability. The conductive vias 262, 264, and/or 266 may be metal-plated (e.g., with air-filled rather than metal-filled centers) in some embodiments, to reduce stress that may occur in thermal cycling.

Figure 7D:
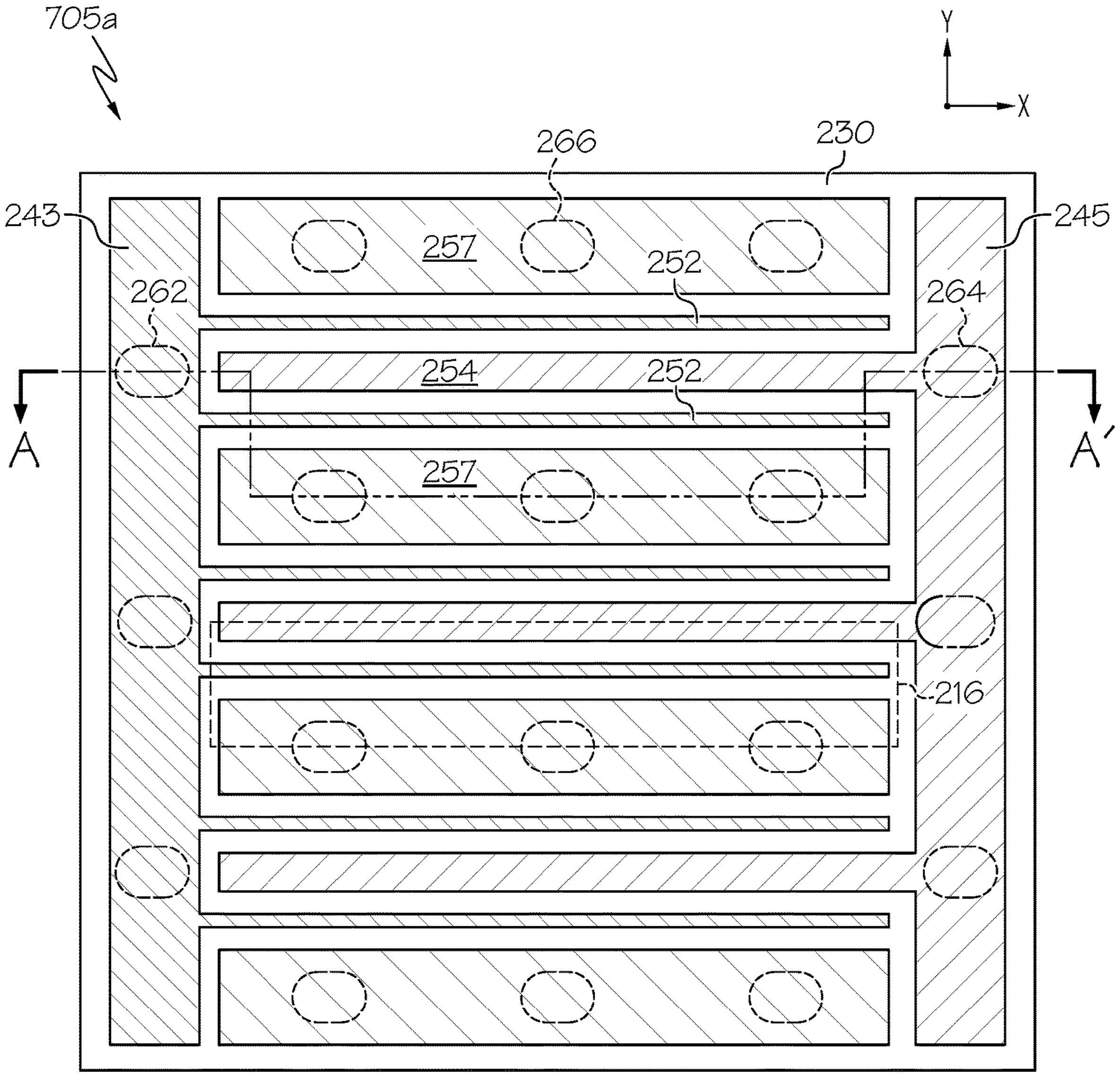
FIG. 7D is a cross-sectional view that is taken through a portion of the top side metallization structure of FIG. 7A.

In some embodiments, the top side metallization structure 240 may include a plurality of gate, drain, and/or source 'fingers', which may be connected by one or more respective buses on an upper surface of the semiconductor layer structure 230. FIG. 7D is a sectional view that is taken through a portion of the top side metallization structure 240 of the die 705*a* of FIG. 7A, along line D-D'. The gate fingers 252, drain fingers 254, and source fingers 257 (and connecting buses) may define part of gate-, drain-, and source-connected electrodes of the die 705*a*, respectively. The gate fingers 252 may be formed of materials that are capable of making a Schottky contact to a Group III nitride-based semiconductor material, such as Ni, Pt, Cu, Pd, Cr, W and/or WSiN. The drain fingers 254 and/or source fingers 257 may include a metal, such as TiAlN, that can form an ohmic contact to Group III nitride-based materials. The gate fingers 252 may be electrically connected to each other by the gate bus 243 and to the bottom gate contact 222 by one or more conductive gate vias 262, and the drain fingers 254 may be electrically connected to each other by the drain bus 245 and to the bottom drain contact 224 by one or more conductive drain vias 264. One or more dielectric layers that help isolate the gate-, drain-, and source-connected structures from each other are not shown to better illustrate the elements.

One of the unit cell transistors 216 is also shown in FIG. 7D. As shown, the unit cell transistor 216 includes a gate finger 252, a drain finger 254 and a source finger 257 along with the underlying portion of the semiconductor layer structure 230. Since the gate fingers 252 are electrically connected to a common gate bus 243, the drain fingers 254 are electrically connected to a common drain bus 245, and the source fingers 257 are electrically connected together via the conductive source vias 266 and the source pad 226/256, it can be seen that the unit cell transistors 216 are all electrically connected together in parallel.

Embodiments of the present disclosure can be built on substrate or laminate (e.g., a redistribution layer (RDL) laminate), and assembled in batches using modern enhanced wafer level packaging techniques. Multiple parts can be built at once, reducing assembly time, cost, and yield issues. In addition, the wire-bonding process may be reduced or eliminated, saving time and cost. Heat generated by the transistor die can be removed effectively and conducted outside the package to a heat sink, for example, using a high-density copper filled array or embedded copper slug to effectively remove the heat (as typical hollow or partially filled vias will not remove the heat effectively enough for high power RF applications). Embodiments of the present disclosure may be used in various cellular infrastructure (CIFR) RF power products (including, but not limited to 5 W, 10 W, 20 W, 40 W, 60 W, 80 W and different frequency bands) e.g., for 5G and base station applications. Embodiments of the present disclosure may also be applied to radar and monolithic microwave integrated circuit (MMIC)-type applications.

Various embodiments have been described herein with reference to the accompanying drawings in which example embodiments are shown. These embodiments may, however, be embodied in different forms and should not be construed as limited to the embodiments set forth herein. Rather, these embodiments are provided so that this disclosure is thorough and complete and fully conveys the inventive concept to those skilled in the art. Various modifications to the example embodiments and the generic principles and features described herein will be readily apparent. In the drawings, the sizes and relative sizes of layers and regions are not shown to scale, and in some instances may be exaggerated for clarity.

It will be understood that, although the terms “first,” “second,” etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term “and/or” includes any and all combinations of one or more of the associated listed items.

The terminology used herein is for the purpose of describing particular embodiments only and is not intended to be limiting of the invention. As used herein, the singular forms “a,” “an” and “the” are intended to include the plural forms as well, unless the context clearly indicates otherwise. It will be further understood that the terms “comprises” “comprising,” “includes” and/or “including” when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, region, or substrate is referred to as being “on,” “attached,” or extending “onto” another element, it can be directly on the other element or intervening elements may also be present. In contrast, when an element is referred to as being “directly on” or “directly attached” or extending “directly onto” another element, there are no intervening elements present. It will also be understood that when an element is referred to as being “connected” or “coupled” to another element, it can be directly connected or coupled to the other element or intervening elements may be present. In contrast, when an element is referred to as being “directly connected” or “directly coupled” to another element, there are no intervening elements present.

Relative terms such as “below” or “above” or “upper” or “lower” or “horizontal” or “lateral” or “vertical” may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Elements illustrated by dotted lines may be optional in the embodiments illustrated.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

In the drawings and specification, there have been disclosed typical embodiments of the invention and, although specific terms are employed, they are used in a generic and descriptive sense only and not for purposes of limitation, the scope of the invention being set forth in the following claims.

That which is claimed:

1. A power amplifier device package, comprising:

a substrate; and a first transistor die comprising a bottom surface on the substrate and top gate and drain contacts on a top surface of the first transistor die opposite the bottom surface, wherein the top and bottom surfaces are external surfaces of the first transistor die, and at least one of the top gate contact or the top drain contact is electrically connected to a respective bottom gate or drain contact on the bottom surface by a respective conductive via structure, and wherein the top gate contact or the top drain contact is connected to a first circuit configured to provide a first function at the top surface of the first transistor die, and wherein the respective bottom gate or drain contact is connected to a second circuit configured to provide a second function at the bottom surface of the first transistor die.

2. The power amplifier device package of claim 1, wherein the top gate contact or the top drain contact is connected to the first circuit free of wirebonds at the top surface of the first transistor die, and/or wherein the respective bottom gate or drain contact is connected to the second circuit free of wirebonds at the bottom surface of the first transistor die.

3. The power amplifier device package of claim 1, wherein the first circuit comprises an inductance element, and the second circuit comprises a package lead.

4. The power amplifier device package of claim 3, wherein the inductance element comprises an integrated interconnect structure having a first contact pad on the top gate contact or the top drain contact.

5. The power amplifier device package of claim 4, further comprising:

conductive routing on the substrate, wherein the respective bottom gate or drain contact is coupled to the package lead by the conductive routing.

6. The power amplifier device package of claim 5, wherein the top gate contact or the top drain contact having the first contact pad of the integrated interconnect structure thereon is electrically connected to the respective bottom gate or drain contact by the respective conductive via structure extending therebetween.

7. The power amplifier device package of claim 4, wherein the integrated interconnect structure is an integrated passive device (IPD) including one or more passive electronic components.

8. The power amplifier device package of claim 7, wherein the IPD is configured to provide a shunt inductance matching circuit.

9. The power amplifier device package of claim 7, wherein the first contact pad is a bond pad, which is electrically connected to the one or more passive electronic components, on a surface of the IPD that is facing the top surface of the first transistor die, wherein the bond pad is connected to the top gate or drain contact by a conductive bump therebetween.

10. The power amplifier device package of claim 7, wherein the IPD comprises an insulating material between conductive elements thereof to define at least one capacitor integrated therein.

11. The power amplifier device package of claim 1, wherein transistor cells of the first transistor die comprise a first stage of a radio frequency (RF) amplifier circuit, and further comprising:

a second transistor die on the substrate and comprising transistor cells that define a second stage of the RF amplifier circuit.

12. The power amplifier device package of claim 1, wherein the first transistor die is attached to the substrate at a source contact on the bottom surface thereof adjacent the respective bottom gate or drain contact.

13. The power amplifier device package of claim 12, wherein the respective bottom gate or drain contact includes both a bottom gate contact and a bottom drain contact, and wherein the source contact is between the bottom gate contact and the bottom drain contact on the bottom surface of the first transistor die.

14. The power amplifier device package of claim 1, wherein the first transistor die comprises a Group III nitride-based material on silicon carbide (SiC), and wherein the respective conductive via structure comprises a through silicon carbide (TSiC) via.

15. A power amplifier device package, comprising:

a substrate; and a first transistor die comprising a bottom surface on the substrate and top gate and drain contacts on a top surface of the first transistor die opposite the bottom surface, wherein the top and bottom surfaces are external surfaces of the first transistor die, and at least one of the top gate contact or the top drain contact is electrically connected to a respective bottom gate or drain contact on the bottom surface by a respective conductive via structure, and wherein the top gate contact or the top drain contact is connected to a first circuit free of wirebonds at the top surface of the first transistor die, and/or wherein the respective bottom gate or drain contact is connected to a second circuit free of wirebonds at the bottom surface of the first transistor die.

16. The power amplifier device package of claim 15, wherein the first circuit comprises an inductance element, and the second circuit comprises a package lead.

17. The power amplifier device package of claim 16, wherein the inductance element comprises an integrated interconnect structure having a first contact pad on the top gate contact or the top drain contact.

18. The power amplifier device package of claim 17, wherein the integrated interconnect structure is an integrated passive device (IPD) including one or more passive electronic components, wherein the first contact pad is electrically connected to the one or more passive electronic components and is connected to the top gate contact or the top drain contact by a conductive bump therebetween.

19. The power amplifier device package of claim 17, wherein the top gate contact or the top drain contact having the first contact pad of the integrated interconnect structure thereon is electrically connected to the respective bottom gate or drain contact by the respective conductive via structure extending therebetween.

20. The power amplifier device package of claim 17, further comprising:

a second die on the substrate, wherein the top gate contact or the top drain contact is coupled to the second die by the integrated interconnect structure.

21. The power amplifier device package of claim 20, wherein:

the second die comprises one or more capacitors; or the second die comprises a plurality of transistor cells that define a stage of an RF amplifier circuit.

* * * * *